(12) United States Patent
Hiraga et al.

(10) Patent No.: US 7,041,332 B2
(45) Date of Patent: May 9, 2006

(54) MODIFICATION METHOD OF SURFACE LAYER OF MOLDED RESIN ARTICLE, AND MODIFICATION APPARATUS OF SURFACE LAYER OF MOLDED RESIN ARTICLE

(75) Inventors: Takashi Hiraga, Ikeda (JP); Tetsuo Moriya, Amagasaki (JP); Qiying Chen, Tsukuba (JP); Junji Tominaga, Tsukuba (JP); Nobufumi Atoda, Tsukuba (JP); Norio Tanaka, Tokyo (JP); Hiromitsu Yanagimoto, Tokyo (JP); Ichiro Ueno, Yokohama (JP); Koji Tsujita, Yokohama (JP)

(73) Assignees: National Institute of Advanced Industrial Science and Technology, Tokyo (JP); Dainichiseika Color & Chemicals Mfg. Co., Ltd., Tokyo (JP)

( * ) Notice: Subject to any disclaimer, the term of this patent is extended or adjusted under 35 U.S.C. 154(b) by 67 days.

(21) Appl. No.: 10/830,136

(22) Filed: Apr. 23, 2004

(65) Prior Publication Data

US 2004/0195206 A1 Oct. 7, 2004

Related U.S. Application Data

(62) Division of application No. 09/913,315, filed as application No. PCT/JP00/02098 on Mar. 31, 2000.

(30) Foreign Application Priority Data

Feb. 27, 1999 (JP) .................................. 11-91038

(51) Int. Cl.
*B28B 7/38* (2006.01)
(52) U.S. Cl. .................................. 427/133; 427/255.6
(58) Field of Classification Search ................ 427/133, 427/255.6, 248.1
See application file for complete search history.

(56) References Cited

U.S. PATENT DOCUMENTS

| 3,783,011 A | 1/1974 | Chauffoureaux |
| 4,059,471 A | 11/1977 | Haigh |
| 4,119,397 A | 10/1978 | Synder |
| 4,202,663 A | 5/1980 | Haigh et al. |
| 4,465,728 A | 8/1984 | Haigh et al. |
| 5,308,426 A | 5/1994 | Claveau |
| 5,719,616 A * | 2/1998 | Danjo et al. ................. 347/214 |
| 5,997,677 A | 12/1999 | Zaher |
| 6,187,704 B1 * | 2/2001 | Takahashi et al. ............ 501/90 |
| 6,420,482 B1 | 7/2002 | Dominguez et al. |
| 6,521,511 B1 * | 2/2003 | Inoue et al. ................. 438/458 |
| 6,534,443 B1 | 3/2003 | Inuzuka |
| 6,554,873 B1 | 4/2003 | Inuzuka et al. |
| 6,613,433 B1 * | 9/2003 | Yamamoto et al. ....... 428/411.1 |
| 6,656,231 B1 | 12/2003 | Inuzuka |
| 2001/0016961 A1 | 3/2001 | Inuzuka et al. |
| 2001/0014988 A1 | 8/2001 | Inuzuka |
| 2001/0018144 A1 | 8/2001 | Inuzuka |
| 2003/0192136 A1 | 10/2003 | Magee et al. |
| 2004/0075724 A1 | 4/2004 | Inuzuka |

FOREIGN PATENT DOCUMENTS

| EP | 0 204 950 A2 | 12/1986 |
| JP | A 47-13678 | 7/1972 |
| JP | A 52-13565 | 2/1977 |
| JP | A 61-264030 | 11/1986 |
| JP | A 9-71672 | 3/1997 |
| WO | WO 99/66097 | 12/1999 |

* cited by examiner

*Primary Examiner*—Bret Chen
(74) *Attorney, Agent, or Firm*—Oliff & Berridge, PLC

(57) ABSTRACT

An organic compound having an affinity for a resin of a molded resin article and sublimation properties is allowed to penetrate/disperse into the surface of the molded resin article, thereby modifying and/or coloring a resin surface layer. The molded resin article and the organic compound having the affinity for the resin and the sublimation properties are put into a tightly closable container, and the pressure and the temperature in the container are adjusted to place them in a saturated sublimation pressure state of the organic compound, whereby a vapor of the organic compound is uniformly deposited on the surface of the molded resin article and it further penetrates/disperses into the resin surface layer, and in consequence, the resin surface layer can be modified and/or colored. In addition, the modification of the resin surface layer permits imparting a function thereto.

3 Claims, 12 Drawing Sheets

MODIFICATION METHOD OF SURFACE LAYER OF MOLDED RESIN ARTICLE, AND MODIFICATION APPARATUS OF SURFACE LAYER OF MOLDED RESIN ARTICLE

This is a Division of application Ser. No. 09/913,315 filed Aug. 10, 2001, which in turn is a National Stage of PCT/JP00/02098, filed Mar. 31, 2000. The entire disclosure of the prior applications is hereby incorporated by reference herein in its entirety.

TECHNICAL FIELD

The present invention relates to a modification method of the surface layer of a molded resin article, an apparatus therefor and a molded resin article whose surface layer is modified; a coloring method of the surface layer of a molded resin article, an apparatus therefor and a molded resin article whose surface layer is colored; and a molded resin article to which a function is imparted by the modification of the surface layer.

BACKGROUND ART

[Modification Method of Resin Surface Layer]

As modification methods of molded resin articles, for example, methods of irradiating the articles with electromagnetic waves such as an X ray or a gamma ray are known. However, modification methods of modifying "a surface layer" alone extending to a certain depth from the surface of each molded resin article but not modifying an inside portion of the molded resin article are extremely limited, and these methods are also accompanied by many restrictions.

For example, a method of hitting an ion beam of a metal or an organic compound on a resin surface is known. However, some restrictions are placed on this method of hitting the ion beam, and for example, it is difficult to uniformly treat the whole of a resin film having a large area, it is also difficult to uniformly treat the whole surface of the molded resin article having a complicated shape, and the organic compounds usable as the ion beam are limited.

Moreover, for example, there is known a method (laser ablation method) of irradiating the resin surface with a laser pulse of a high power density for a short time to modify the resin surface. However, similarly on the laser ablation method, some restrictions are placed, and for example, it is difficult to uniformly treat the entire large-area resin film, and it is also difficult to uniformly treat the entire surface of the molded resin article having a complicated shape.

Furthermore, for example, there is known a method of subjecting the resin surface to a plasma treatment under atmospheric pressure to oxidize/modify the surface, but some restrictions are placed on this method, and for example, the method cannot be applied to a surface which is hard to be oxidized, and the effect does not last for a long time.

When a treatment agent for modifying the resin surface layer is a liquid, the treatment agent can be applied onto the surface of the molded resin article. On the other hand, when it is a solid, it can be applied thereonto in the form of a solution obtained by using an appropriate solvent, or the molded resin article can be immersed in the solution. However, in such a wet type method, the smoothness or the fine structure of the resin surface is easily lost, and washing is further necessary so that the excess treatment agent may not remain on the resin surface. During this washing, the effect of the surface treatment tends to be impaired. Moreover, when the solvent is used, some restrictions are placed on the method, and for example, there is an inconvenience that the resin surface swells owing to the solvent.

Moreover, there has also widely been used a method of mixing/kneading the treatment agent for modifying the resin surface layer with the whole resin, followed by molding. However, in this method, the treatment agent which is usually necessary only for the surface layer needs to be mixed with the whole resin, and as a result, the treatment agent mixed with the whole resin adversely affects the physical properties of the resin sometimes. On the other hand, in order to prevent the treatment agent mixed with the whole resin from adversely affecting the physical properties of the resin, some inconveniences are present. For example, the treatment agent cannot be added in a necessary and sufficient amount, and kinds of treatment agents which can be mixed with the whole resin are restricted.

[Coloring Method of the Surface of Molded Resin Article]

As a coloring method of the molded resin article, there are broadly used, for example, after kneading a dye or a pigment with a resin, (1) a method of injection-molding the resin to obtain a colored molded resin article, (2) a method of stretching the resin to obtain a colored film-like article, and (3) a method of spinning the resin to obtain a fiber-like article.

On the other hand, as a method of coloring the surface only of the molded resin article without changing its internal composition, various coating methods and printing methods are broadly used.

Except for an especial method of depositing a dyestuff alone penetrable into the resin surface layer on the surface of the molded resin article by the coating method or the printing method and then allowing the dyestuff to penetrate thereinto, in the case of the usual coating method or printing method, a layer comprising a mixture of a binder resin and a dye or a pigment is formed on the resin surface. Strictly speaking, such a coloring method means not "coloring of the surface itself", but "adding and attaching a colored film to the surface". Therefore, if the resin surface is finely worked, there is a problem that the finely worked portion is buried with the added film. Moreover, when the coating method is used, the smoothness or the like on the surface of the molded resin article tends to be impaired owing to dissolution or swelling with the coating solvent. Therefore, it is required to avoid the dissolution or the swelling of the resin surface layer, but any appropriate coating solvent cannot be found. In consequence, it is difficult to apply the coating method on occasion. For example, when a film comprising a dyestuff and poly(methyl methacrylate) is formed on the surface of the molded resin article of poly(methyl methacrylate) by the coating method in which a solvent is used; the solvent for dissolving poly(methyl methacrylate) necessarily erodes the surface of the molded resin article of poly(methyl methacrylate), and hence, it is not easy to obtain the smooth coated surface.

In the case of depositing a coating film or a print film containing a sublimable dyestuff on the resin surface to color the surface, the following problems further occur.

(i) In applying or printing a composition comprising the sublimable dyestuff and the resin, the sublimable dyestuff sublimates in the course of a process sometimes. Therefore, control for maintaining the composition and control for uniforming the composition are not easy.

(ii) It is extremely difficult that the sublimable dyestuff alone is left as it is and other volatile impurities are removed.

Therefore, it is not easy to prepare the coating film or the print film which does not contain the volatile impurities other than the sublimable dyestuff.

Besides the method of forming the coating film or the print film on the resin surface, a deposited film of the sublimable dyestuff may be formed to color the molded resin article. In a usual vapor deposition method, temperature of a vapor deposition source is set to be higher than temperature of a substrate subjected to film formation, and the vapor of the organic compound which flies from the vapor deposition source is deposited on the surface of the substrate subjected to film formation with lower temperature. In the film forming method under such non-equilibrium conditions, film thickness control is performed mainly by mechanical means. That-is, a mask or a slit is placed in a space extending to the substrate to be filmed thereon from the vapor deposition source, and the concentration of the vapor of the organic compound is then controlled in a spatial manner, or the, substrate to be filmed thereon is rotated, whereby the thickness of the deposited film can be uniformed. However, when a vapor pressure of an organic compound (dyestuff) is high and sublimation easily occurs, it is not easy to obtain a uniform thickness of the deposited film only with such mechanical means.

As an image printing method using sublimation, a sublimable dye transfer method is known. That is, the sublimable dyestuff formed into the film on the surface of a sublimable dye transfer ribbon or sheet is heated with a heating head, sublimated, and deposited or allowed to penetrate into a transfer layer (thin film of thermoplastic resin) of a sheet surface disposed in the vicinity in the method. In principle, the method is equivalent to the vapor deposition method, and image density is controlled by a heating area and heating amount in the heating head. Therefore, this is suitable for a purpose of printing an image having a fine gradation in principle of "pointillism", but unsuitable for coloring the resin surface of a large area with a uniform density. Moreover, it is unsuitable for coloring the molded resin article having a complicated surface shape.

DISCLOSURE OF THE INVENTION

The present invention solves the aforementioned problems, and an object thereof is to provide:

(a) a method of preparing a modified surface layer comprising a sublimable organic compound and resin with a uniform composition on the surface of a molded resin article;

(b) a method of preparing a modified surface layer containing the sublimable organic compound and containing no volatile impurity on the surface of the molded resin article;

(c) a method of efficiently preparing a modified surface layer comprising the sublimable organic compound and resin with a uniform composition on the surface of the molded resin article;

(d) a method of preparing a modified surface layer, containing the sublimable organic compound on the surface of the molded resin article without deteriorating a surface smoothness of the molded resin article;

(e) a method of preparing a modified surface layer containing the sublimable organic compound on the surface of the molded resin article without deteriorating a surface structure when the surface of the molded resin article is subjected to a fine processing;

(f) a method of preparing a modified surface layer containing a broad range of types of sublimable organic compounds on the surface of the molded resin article;

(g) a method of preparing a modified surface layer containing a sublimable organic compound uniform in film thickness and/or composition on the surface of the molded resin article without any complicated mechanical control;

(h) a method of preparing a modified surface layer containing a sublimable organic compound having a uniform film thickness and/or composition on the surface of the molded resin article irrespective of an area size of the surface layer;

(i) an apparatus for preparing the modified surface layer having the aforementioned characteristics (a) to (h) on the surface of the molded resin article;

(j) a molded resin article with the modified surface layer having the aforementioned characteristics (a) to (h);

(k) a method of preparing a colored surface layer comprising a sublimable dyestuff and resin with a uniform composition on the surface of the molded resin article;

(l) a method of preparing a colored surface layer containing the sublimable dyestuff and containing no volatile impurity on the surface of the molded resin article;

(m) a method of efficiently preparing a colored surface layer comprising the sublimable dyestuff and resin with a uniform composition on the surface of the molded resin article;

(n) a method of preparing a colored surface layer containing the sublimable dyestuff on the surface of the molded resin article without deteriorating the surface smoothness of the molded resin article;

(o) a method of preparing a colored surface layer containing the sublimable dyestuff on the surface of the molded resin article without deteriorating the surface structure when the surface of the molded resin article is subjected to the fine processing;

(p) a method of preparing a colored surface layer containing a broad range of types of sublimable dyestuffs on the surface of the molded resin article;

(q) a method of preparing a colored surface layer containing a sublimable dyestuff uniform in film thickness and/or composition on the surface of the molded resin article without any complicated mechanical control;

(r) a method of preparing a colored surface layer containing a sublimable dyestuff having a uniform film thickness and/or composition on the surface of the molded resin article irrespective of the area size of the surface layer;

(s) an apparatus for forming the colored surface layer having the aforementioned characteristics (k) to (r) on the surface of the molded resin article;

(t) a molded resin article with the colored surface layer having the aforementioned characteristics (k) to (r); and (u) a molded resin article in which the surface layer is modified to impart functional characteristics to the surface layer.

In order to achieve the aforementioned object, a modification method of the surface layer of a molded resin article of the present invention according to claim 1 is characterized by:

placing, in a closed space, an organic compound having sublimation properties and an affinity for a resin of a molded resin article to be coated, and the molded resin article;

placing the closed space in a saturated sublimation pressure state of the organic compound;

uniformly depositing a vapor of the organic compound on the surface of the molded resin article; and allowing the deposited organic compound to penetrate/disperse from the surface of the molded resin article into its inside.

Here, a saturated sublimation pressure is also called a saturated vapor pressure, means a vapor pressure in a certain constant temperature of a thermodynamic system, and means that a substance vapor pressure is in an equilibrium state on the solid phase surface of a substance. The saturated vapor pressure does not depend on a substance amount, depends only on temperature, and monotonously increases with a temperature rise. A change state is represented by the following Clausis-Clapeyron equation.

$$dp/dT=Q/T\Delta V \quad (1)$$

Here, Q denotes an absorbed heat amount when a unit mass of substance (solid) turns to a gas (vapor) (sublimation heat; the absorption of this heat amount does not cause the rise of a substance temperature), $\Delta V$ denotes a volume difference per unit mass in a phase change from solid to gas, p denotes a saturated vapor pressure, and T denotes a temperature.

Moreover, in order to achieve the object, a modification method of the surface layer of a molded resin article of the present invention according to claim 2 is characterized by:

placing an organic compound having sublimation properties and an affinity for a resin of a molded resin article to be coated in a first closed space;

on the other hand, placing the molded resin article in a second closed space;

controlling a temperature in the second closed space so as to be equal to or higher than the temperature in the first closed space;

brining a pressure in the first closed space to a saturated sublimation pressure state of the organic compound;

controlling the pressure in the second closed space so as to be equal to or lower than the pressure in the first closed space;

subsequently, connecting the first closed space to the second closed space to form a third closed space in which the first closed space is combined with the second closed space, and further controlling the temperature and the pressure so that the whole of the third closed space may be in the saturated sublimation pressure state of the organic compound;

allowing a vapor of the organic compound with which the first closed space before the connection is filled to diffuse into the second closed space before the connection;

uniformly depositing the vapor of the organic compound on the surface of the molded resin article; and allowing the deposited organic compound to penetrate/disperse from the surface of the molded resin article into its inside.

Furthermore, in order to achieve the object, a modification method of the surface layer of a molded resin article of the present invention according to claim 3 is characterized in that:

in the modification method of the surface layer of the molded resin article according to claim 1, the organic compound is deposited on or contained in a sublimation source substrate in at least one manner selected from the group consisting of the following five manners (A) to (E) so that the organic compound can be deposited on the surface of the molded resin article:

(A) the organic compound being singly applied onto the surface of the sublimation source substrate, or formed into a film on the surface;

(B) the organic compound and a binder resin being applied onto the surface of the sublimation source substrate, or formed into a film the surface;

(C) a porous particle impregnated with the organic compound being applied onto the surface of the sublimation source substrate, or formed into a film on the surface;

(D) the porous particle impregnated with the organic compound and the binder resin being applied onto the surface of the sublimation source substrate, or formed into a film on the surface; and (E) a hole in the surface of a porous sublimation source substrate being impregnated with the organic compound.

Additionally, in order to achieve the object, a modification method of the surface layer of a molded resin article of the present invention according to claim 4 is characterized in that:

in the modification method of the resin surface layer according to claim 3, the surface of the sublimation source substrate, on or in which the organic compound is deposited or contained in any one manner of the aforementioned manners (A) to (E), is disposed in the vicinity of the surface of the molded resin article.

Here, "vicinity" means that the surface of the sublimation source substrate is as close as possible to the surface of the molded resin article as long as the surfaces do not contact each other. For example, if the surfaces of both the sublimation source substrate and the molded resin article are smooth flat surfaces with a surface concave/convex being less than 1 μm, a distance between the flat surfaces is preferably reduced in a micrometer order. However, in consideration of ease of operation during surface layer modifying/coloring treatment, this distance is set as a lower limit, and vicinity of several millimeters to about 10 millimeters is preferable.

Moreover, in order to achieve the object, a modification method of the surface layer of a molded resin article of the present invention-according to claim 5 is characterized by:

in the modification method of the resin surface layer according to claim 1, placing the molded resin article and the organic compound in a vacuum container;

exhausting air through a vacuum valve disposed in the vacuum container to reduce the pressure in the vacuum container to a saturated sublimation pressure of the organic compound at a temperature which is equal to or higher than room temperature and which does not exceed a thermal decomposition temperature of the organic compound and/or the resin;

tightly closing all the vacuum valves disposed in the vacuum container to form a closed space;

raising the temperature in the tightly closed vacuum container up to a temperature at which a partial pressure of the organic compound reaches the saturated sublimation pressure in the reduced pressure state; and after the heating for a predetermined time, slowly cooling the vacuum container.

Furthermore, in order to achieve the object, a modification method of the surface layer of a molded resin article of the present invention according to claim 6 is characterized by:

in the modification method of the resin surface layer according to claim 3, placing, in a vacuum container, the organic compound deposited on or contained in the sublimation source substrate in any one manner of the manners according to claim 3, and the molded resin article;

exhausting air through a vacuum valve disposed in the vacuum container to reduce the pressure in the vacuum container to a saturated sublimation pressure of the organic compound at a temperature which is equal to or higher than room temperature and which does not exceed a thermal decomposition temperature of the organic compound and/or the resin;

tightly closing all the vacuum valves disposed in the vacuum container to form a closed space;

raising the temperature in the tightly closed vacuum container up to a temperature at which a partial pressure of the organic compound reaches the saturated sublimation pressure in the reduced pressure state; and after the heating for a predetermined time, slowly cooling the vacuum container.

Additionally, in order to achieve the object, a modification method of the surface layer of a molded resin article of the present invention according to claim 7 is characterized by:

in the modification method of the resin surface layer according to claim 4, placing, in a vacuum container, the organic compound deposited on or contained in the sublimation source substrate in any one manner of the manners according to claim 3, and the molded resin article;

exhausting air through a vacuum valve disposed in the vacuum container to reduce the pressure in the vacuum container to a saturated sublimation pressure of the organic compound at a temperature which is equal to or higher than room temperature and which does not exceed a thermal decomposition temperature of the organic compound and/or the resin;

tightly closing all the vacuum valves disposed in the vacuum container to form a closed space;

raising the temperature in the tightly closed vacuum container up to a temperature at which a partial pressure of the organic compound reaches the saturated sublimation pressure in the reduced pressure state; and after the heating for a predetermined time, slowly cooling the vacuum container.

Moreover, in order to achieve the object, a modification method of the surface layer of a molded resin article of the present invention according to claim 8 is characterized by:

in the modification method of the resin surface layer according to claim 1, placing the molded resin article and the organic compound in a vacuum container;

raising the temperature in the vacuum container up to a temperature which is equal to or higher than room temperature and which does not exceed a thermal decomposition temperature of the organic compound and/or the resin;

while keeping the above temperature, exhausting air through a vacuum valve disposed in the vacuum container to reduce the pressure in the vacuum container to a saturated sublimation pressure of the organic compound at the above temperature;

tightly closing all the vacuum valves disposed in the vacuum container to form a closed space; and after the heating and the pressure reduction for a predetermined time, slowly cooling the vacuum container.

Furthermore, in order to achieve the object, a modification method of the surface layer of a molded resin article of the present invention according to claim 9 is characterized by:

in the modification method of the resin surface layer according to claim 3, placing, in a vacuum container, the organic compound deposited on or contained in the sublimation source substrate in any one manner of the manners according to claim 3, and the molded resin article;

raising the temperature in the vacuum container up to a temperature which is equal to or higher than room temperature and which does not exceed a thermal decomposition temperature of the organic compound and/or the resin;

while keeping the above temperature, exhausting air through a vacuum valve disposed in the vacuum container to reduce the pressure in the vacuum container to a saturated sublimation pressure of the organic compound at the above temperature;

tightly closing all the vacuum valves disposed in the vacuum container to form a closed space; and after the heating and the pressure reduction for a predetermined time, slowly cooling the vacuum container.

Additionally, in order to achieve the object, a modification method of the surface layer of a molded resin article of the present invention according to claim 10 is characterized by:

in the modification method of the resin surface layer according to claim 4, placing, in a vacuum container, the organic compound deposited on or contained in the sublimation source substrate in any one manner of the manners according to claim 3, and the molded resin article;

raising the temperature in the vacuum container up to a temperature which is equal to or higher than room temperature and which does not exceed a thermal decomposition temperature of the organic compound and/or the resin;

while keeping the above temperature, exhausting air through a vacuum valve disposed in the vacuum container to reduce the pressure in the vacuum container to a saturated sublimation pressure of the organic compound at the above temperature;

tightly closing all the vacuum valves disposed in the vacuum container to form a closed space; and after the heating and the pressure reduction for a predetermined time, slowly cooling the vacuum container.

Moreover, in order to achieve the object, a modification method of the surface layer of a molded resin article of the present invention according to claim 11 is characterized by:

in the modification method of the resin surface layer according to claim 2, placing the organic compound having the sublimation properties and the affinity for the resin of the molded resin article to be coated in a first vacuum container provided with a pipe to an exhaust system, an introducing portion of the organic compound and a connection pipe to a second vacuum container, closing the organic compound introducing portion and the connection pipe to the second vacuum container, reducing the pressure in the first vacuum container through the exhaust system to a saturated sublimation pressure of the organic compound at a temperature which is equal to or higher than room temperature and which does not exceed a thermal decomposition temperature of the organic compound and/or the resin, and raising the temperature in the first vacuum container up to the above temperature;

on the other hand, placing the molded resin article in the second vacuum container provided with a pipe to an-exhaust system, an introducing portion of the molded resin article and a connection pipe to the first vacuum container, and closing the molded resin article introducing portion and the connection pipe to the first vacuum container;

controlling a temperature in the second vacuum container so as to be equal to or higher than the temperature in the first vacuum container;

bringing a pressure in the first vacuum container to a saturated sublimation pressure state of the organic compound;

controlling the pressure in the second vacuum container so as to be equal to or lower than the pressure in the first vacuum container;

subsequently, connecting the first vacuum container to the second vacuum container via a mutual connection pipe to form the third closed space in which the first closed space in the first vacuum container is combined with the second closed space in the second vacuum container, and further controlling the temperature and the pressure so that the whole of the third closed space may be in the saturated sublimation pressure state of the organic compound;

allowing the vapor of the organic compound with which the first vacuum container before the connection is filled to diffuse into the second vacuum container before the connection;

uniformly depositing the vapor of the organic compound on the surface of the molded resin article;

heating for a predetermined time to allow the deposited organic compound to penetrate/disperse from the surface of the molded resin article into its inside;

closing the connection pipe which connects the first vacuum container to the second vacuum container;

controlling the temperature and the pressure in the second vacuum container for a predetermined time so that the vapor of the organic compound which remains inside the second vacuum container may penetrate/disperse from the surface of the molded resin article into its inside;

when the vapor of the organic compound excessively exists in the second vacuum container, exhausting the vapor of the organic compound from the second vacuum container through the exhaust system; and then returning the temperature of the molded resin article in the second vacuum container to ordinary temperature.

Furthermore, in order to achieve the object, a modification method of the surface layer of a molded resin article of the present invention according to claim 12 is characterized by:

in the modification method of the resin surface layer according to claim 11, instead of returning the temperature of the molded resin article in the second vacuum container to ordinary temperature in a final stage, transporting the molded resin article under a reduced pressure into a fourth vacuum container which is disposed adjacent to the second vacuum container via a gate valve and in which the pressure can independently be controlled, and then returning the temperature of the molded resin article to ordinary temperature.

Additionally, in order to achieve the object, a modification method of the surface layer of a molded resin article of the present invention according to claim 13 is characterized by:

in the modification method of the resin surface layer according to any one of claims 5, 6, 7, 8, 9, 10, 11 and 12, uniformly depositing the vapor of the organic compound on the surface of the molded resin article; and in order to allow the deposited organic compound to penetrate/disperse from the surface of the molded resin article into its inside, raising the temperature of the molded resin article to a temperature which is equal to or higher than a glass transition temperature of the resin and which does not exceed the thermal decomposition temperature of the organic compound and/or the resin.

Moreover, in order to achieve the object, a coloring method of the surface layer of a molded resin article of the present invention according to claim 14 is characterized by:

in the modification method of the resin surface layer according to any one of claims 1, 2, 3, 4, 5, 6, 7, 8, 9, 10, 11 and 12, using a dyestuff having the sublimation properties and the affinity for the resin of the molded resin article to be coated as the organic compound to modify and simultaneously color the surface layer of the molded resin article.

Furthermore, in order to achieve the object, a coloring method of the surface layer of a molded resin article of the present invention according to claim 15 is characterized by:

in the modification method of the resin surface layer according to claim 13, using a dyestuff having the sublimation properties and the affinity for the resin of the molded resin article to be coated as the organic compound to modify and simultaneously color the surface layer of the molded resin article.

Additionally, in order to achieve the object, a modification apparatus for the surface layer of a molded resin article of the present invention according to claim 16 is characterized by disposing:

a tightly closable container for placing an organic compound having sublimation properties and an affinity for a resin of a molded resin article to be coated, and the molded resin article in a saturated sublimation pressure state of the organic compound;

an exhaust system for adjusting a pressure in the tightly closable container; and heating means for allowing the organic compound to penetrate/disperse into the molded resin article, after the organic compound sublimes and a vapor of the organic compound is deposited on the surface of the molded resin article.

Moreover, in order to achieve the object, a modification apparatus for the surface layer of a molded resin article of the present invention according to claim 17 is characterized by disposing:

in the modification apparatus for the surface layer of the molded resin article according to claim 16, a sublimation source substrate on which the organic compound is held in at least one manner selected from the group consisting of the following five manners (A) to (E) so that the organic compound can be deposited on the surface of the molded resin article:

(A) The organic compound is singly applied onto the surface of the sublimation source substrate, or formed into a film on the surface;

(B) the organic compound and a binder resin are applied onto the surface of the sublimation source substrate, or formed into the film on the surface;

(C) a porous particle impregnated with the organic compound is applied onto the surface of the sublimation source substrate, or formed into the film on the surface;

(D) the porous particle impregnated with the organic compound and a binder resin are applied onto the surface of the sublimation source substrate, or formed into the film on the surface; and (E) a hole in the surface of a porous sublimation source substrate is impregnated with the organic compound.

Furthermore, in order to achieve the object, a modification apparatus for the surface layer of a molded resin article of the present invention according to claim 18 is characterized by disposing:

a tightly closable first vacuum container for placing an organic compound having sublimation properties and an affinity for a resin of a molded resin article to be coated in a saturated sublimation pressure state;

a tightly closable second vacuum container for placing the molded resin article in the saturated sublimation pressure state of the organic compound;

a connection pipe for connecting the first vacuum container to the second vacuum container;

an opening/closing mechanism of the connection pipe;

an exhaust system for independently adjusting the pressure in the first vacuum container;

an exhaust system for independently adjusting a pressure in the second vacuum container; and heating means for allowing the organic compound to penetrate/disperse into the molded resin article, after the organic compound sublimes and a vapor of the organic compound is deposited on the surface of the molded resin article.

Additionally, in order to achieve the object, a modification apparatus for the surface layer of a molded resin article of the present invention according to claim 19 is characterized by disposing:

in the modification apparatus of the resin surface layer according to anyone of claims 16, 17 and 18, a stirring mechanism for stirring the molded resin article of a powder form.

Moreover, in order to achieve the object, a modification apparatus for the surface layer of a molded resin article of the present invention according to claim 20 is characterized by disposing:

in the modification apparatus of the resin surface layer according to any one of claims 16, 17 and 18, a wind-up mechanism for winding up the molded resin article of a form selected from a textile form, a fiber form and a film form around a reception side reel from a supply side reel under reduced pressure.

Furthermore, in order to achieve the object, a coloring apparatus of the surface layer of a molded resin article of the present invention according to claim 21 is characterized by disposing:

a tightly closable container for placing a dyestuff having sublimation properties and an affinity for a resin of a molded resin article to be colored, and the molded resin article in a saturated sublimation pressure state of the dyestuff;

an exhaust system for adjusting a pressure in the tightly closable container; and heating means for allowing the dyestuff to penetrate/disperse into the molded resin article, after the dyestuff sublimes and a vapor of the dyestuff is deposited on the surface of the molded resin article.

Additionally, in order to achieve the object, a coloring apparatus of the surface layer of a molded resin article of the present invention according to claim 22 is characterized by further disposing:

in the coloring apparatus of the surface layer of the molded resin article according to claim 21, a sublimation source substrate on which the dyestuff is held in at least one manner selected from the group consisting of the aforementioned five manners (A) to (E) so that the dyestuff can be deposited on the surface of the molded resin article.

Moreover, in order to achieve the object, a coloring apparatus of the surface layer of a molded resin article of the present invention according to claim 23 is characterized by disposing:

a tightly closable first vacuum container for placing a dyestuff having sublimation properties and an affinity for a resin of a molded resin article to be colored in a saturated sublimation pressure state;

a tightly closable second vacuum container for placing the molded resin article in the saturated sublimation pressure state of the dyestuff;

a connection pipe for connecting the first vacuum container to the second vacuum container;

an opening/closing mechanism of the connection pipe;

an exhaust system for independently adjusting the pressure in the first vacuum container;

an exhaust system for independently adjusting a pressure in the second vacuum container; and heating means for allowing the dyestuff to penetrate/disperse into the molded resin article, after the dyestuff sublimes and a vapor of the dyestuff is deposited on the surface of the molded resin article.

Furthermore, in order to achieve the object, a coloring apparatus of the surface layer of a molded resin article of the present invention according to claim 24 is characterized by disposing:

in the coloring apparatus of the resin surface layer according to any one of claims 21, 22 and 23, a stirring mechanism for stirring the molded resin article of a powder form.

Additionally, in order to achieve the object, a coloring apparatus of the surface layer of a molded resin article of the present invention according to claim 25 is characterized by disposing:

in the coloring apparatus of the resin surface layer according to any one of claims 21, 22 and 23, a wind-up mechanism for winding up the molded resin article of a form selected from a textile form, a fiber form and a film form around a reception side reel from a supply side reel under reduced pressure.

Moreover, in order to achieve the object, a molded resin article of the present invention according to claim 26 is characterized in that:

a surface layer is modified by the modification method of the resin surface layer according to any one of claims 1, 2, 3, 4, 5, 6, 7, 8, 9, 10, 11 and 12.

Furthermore, in order to achieve the object, a molded resin article of the present invention according to claim 27 is characterized in that:

a surface layer is modified by the modification method of the resin surface layer according to claim 13.

Additionally, in order to achieve the object, a molded resin article of the present invention according to claim 28 is characterized in that:

a surface layer is colored by the coloring method of the resin surface layer according to claim 14.

Moreover, in order to achieve the object, a molded resin article of the present invention according to claim 29 is characterized in that:

a surface layer is colored by the coloring method of the resin surface layer according to claim 15.

Furthermore, in order to achieve the object, a plastic lens of the present invention according to claim 30 is characterized in that:

a surface layer is modified by the modification method of the resin surface layer according to any one of claims 1, 2, 3, 4, 5, 6, 7, 8, 9, 10, 11 and 12.

Additionally, in order to achieve the object, a plastic lens of the present invention according to claim 31 is characterized in that:

a surface layer is colored by the coloring method of the resin surface layer according to claim 14.

Moreover, in order to achieve the object, a resin coat lens of the present invention according to claim 32 is characterized in that:

a resin surface layer is modified by the modification method of the resin surface layer according to any one of claims 1, 2, 3, 4, 5, 6, 7, 8, 9, 10, 11 and 12.

Furthermore, in order to achieve the object, a resin coat lens of the present invention according to claim 33 is characterized in that:

a resin surface layer is colored by the coloring method of the resin surface layer according to claim 14.

Additionally, in order to achieve the object, a plastic film of the present invention according to claim 34 is characterized in that:

a surface layer is modified by the modification method of the resin surface layer according to any one of claims 1, 2, 3, 4, 5, 6, 7, 8, 9, 10, 11 and 12.

Moreover, in order to achieve the object, a plastic film of the present invention according to claim 35 is characterized in that:

a surface layer is colored by the coloring method of the resin surface layer according to claim 14.

Furthermore, in order to achieve the object, a fiber of the present invention according to claim 36 is characterized in that:

a surface layer is modified by the modification method of the resin surface layer according to any one of claims 1, 2, 3, 4, 5, 6, 7, 8, 9, 10, 11 and 12.

Additionally, in order to achieve the object, a fiber of the present invention according to claim 37 is characterized in that:

a surface layer is colored by the coloring method of the resin surface layer according to claim 14.

Moreover, in order to achieve the object, a plastic optical fiber of the present invention according to claim 38 is characterized in that:

a surface layer is modified by the modification method of the resin surface layer according to any one of claims 1, 2, 3, 4, 5, 6, 7, 8, 9, 10, 11 and 12.

Furthermore, in order to achieve the object, a plastic optical fiber of the present invention according to claim 39 is characterized in that:

a surface layer is colored by the coloring method of the resin surface layer according to claim 14.

Additionally, in order to achieve the object, a molded resin article of the present invention according to claim 40 is characterized in that:

the surface layer of the molded resin article is modified with a fluorescent dyestuff having sublimation properties and an affinity for a resin of the molded resin article to be coated, by the modification method of the resin surface layer according to any one of claims 1, 2, 3, 4, 5, 6, 7, 8, 9, 10, 11 and 12 to impart a fluorescent light emitting function to the surface layer.

Moreover, in order to achieve the object, a molded resin article of the present invention according to claim 41 is characterized in that:

the surface layer of the molded resin article is modified with a photochromic dyestuff having sublimation properties and an affinity for a resin of the molded resin article to be coated, by the modification method of the resin surface layer according to any one of claims 1, 2, 3, 4, 5, 6, 7, 8, 9, 10, 11 and 12 to impart a photochromic function to the surface layer.

Furthermore, in order to achieve the object, a molded resin article of the present invention according to claim 42 is characterized in that:

the surface layer of the molded resin article is modified with an organic metal compound having sublimation properties and an affinity for a resin of the molded resin article to be coated, by the modification method of the resin surface layer according to any one of claims 1, 2, 3, 4, 5, 6, 7, 8, 9, 10, 11 and 12 to impart an X ray and/or electron ray and/or ray absorption function to the surface layer.

Additionally, in order to achieve the object, a molded resin article of the present invention according to claim 43 is characterized in that:

an antibacterial or antifungal agent having sublimation properties and an affinity for a resin of the molded resin article to be coated is used, and the modification of the surface layer is performed by the modification method of the resin surface layer according to any one of claims 1, 2, 3, 4, 5, 6, 7, 8, 9, 10, 11 and 12 to provide a surface layer with an antibacterial or antifungal function.

Moreover, in order to achieve the object, a molded resin article of the present invention according to claim .44 is characterized in that:

a medicinal activity organic compound having sublimation properties and an affinity for a resin of the molded resin article to be coated is used, and the modification of the surface layer is performed by the modification method of the resin surface layer according to any one of claims 1, 2, 3, 4, 5, 6, 7, 8, 9, 10, 11 and 12 to provide a surface layer with a medicinal activity function.

Furthermore, in order to achieve the object, a molded resin article of the present invention according to claim 45 is characterized in that:

an organic compound having sublimation properties and an affinity for a resin of the molded resin article to be coated, and assuming a physiological activity to an animal/plant is used, and the modification of the surface layer is performed by the modification method of the resin surface layer according to any one of claims 1, 2, 3, 4, 5, 6, 7, 8, 9, 10, 11 and 12 to provide a surface layer with a function as an agricultural chemical.

BRIEF DESCRIPTION OF THE DRAWINGS

FIG. 2 is a sectional view showing a schematic constitution of the modification/coloring apparatus for the resin surface layer in one step of the modification/coloring method of the resin surface layer in Example 1.

BEST MODE FOR CARRYING OUT THE INVENTION

Figure 1:
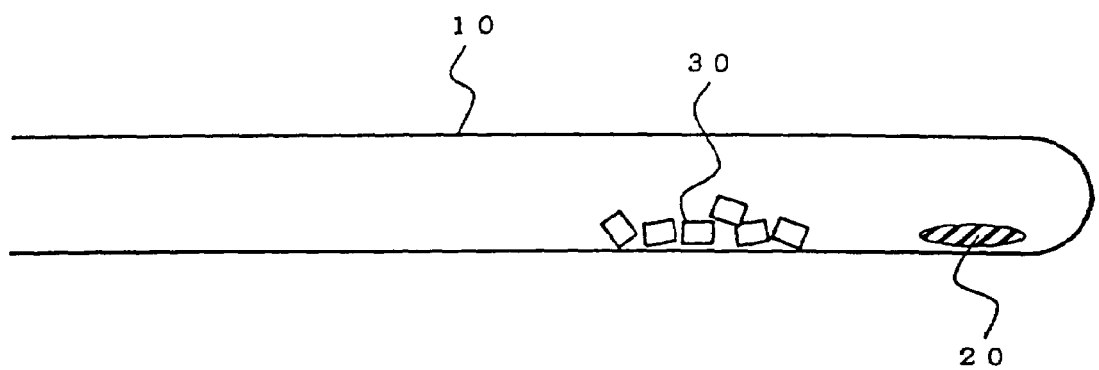
FIG. 1 is a sectional view showing a schematic constitution of a modification/coloring apparatus for a resin surface layer in one step of a modification/coloring method of the resin surface layer in Example 1.

A preferred embodiment of the present invention will be described hereinafter in detail.

[Modification of Resin Surface Layer]

In the present invention, the modification of the surface layer of a molded resin article means that physical properties of a surface layer portion to a predetermined depth from the surface of a molded resin article, such as density, hardness, impact strength, modulus of elasticity, sound velocity, dielectric constant, magnetic permeability, electric conductivity, surface resistance, volume resistance, photoconductivity, static electricity charging order, charging properties, light transmittance, light reflectance, light polarizing properties, refractive index, second-order nonlinear optical susceptibility, third-order nonlinear optical susceptibility, nonlinear refractive index, hydrophilic nature, contact angle with water, hydrophobic nature, lipophilic nature, gas transmittance and water absorbing ratio are changed so as to be different from those of a resin alone. Moreover, the above modification includes a case where the surface layer of the molded resin article is modified, oxidative decomposition reaction, thermal decomposition reaction, optical decomposition reaction by an ultraviolet ray and/or a visible ray are suppressed in contrast to a case of a resin alone. Moreover, the above modification includes a case where the surface layer of the molded resin article is modified to impart functions such as fluorescent, phosphorescent and photochromic, photorefractive effects to the surface layer of the molded resin article in contrast to a case of a resin alone. Furthermore, the above modification includes a case where the surface layer of the molded resin article is modified to impart a physiological activity function and/or a medicinal activity function such as an antibacterial action and antifungal action to the surface layer of the molded resin article.

Here, the thickness of the modified surface layer, i.e., the depth of the modified surface layer from the surface is a diameter of one atom or molecule as a lower limit and the whole thickness of the molded resin article as an upper limit.

[Coloring of Resin Surface Layer]

When the light transmittance and/or the light reflectance and/or the light refractive index of the surface layer are changed by modifying the surface layer of the molded resin article, an apparent color changes from that before the modification. That is, coloring of the resin surface layer can be regarded as one type of surface modification. When a sublimable organic compound for use to change the physical properties of the resin surface layer is colored, color of the resin surface layer is obtained by adding the colored organic compound to an inherent resin color.

In the present invention, the modification of the resin surface layer for a purpose of changing the apparent color of the molded resin article is called "coloring".

[Molded Resin Article]

The modification/coloring method of the surface layer of the molded resin article of the present invention is characterized by placing an organic compound having sublimation properties and an affinity for a resin of the molded resin article to be coated in a saturated sublimation pressure state of the organic compound, uniformly depositing a vapor of the organic compound on the surface of the molded resin article, and allowing the deposited organic compound to penetrate/disperse from the surface of the molded resin article into its inside.

Here, the molded resin article may be of an arbitrary form. Concretely, usable are articles obtained by molding a resin material into a block form, spherical form, hemispherical form, pellet form, cylindrical form, pipe form, tubular form, rectangular parallelepiped, cube, prism form, cone, triangular pyramid, square pyramid, lens form, flat plate form, sheet form, film form, thin film form, thin film form disposed on a substrate of glass or the like, fiber form, textile, plastic optical fiber, and the like; a molded plastic material having an arbitrary shape obtained by a molding method such as an injection molding method; and the like. The fiber-form molded resin article may further be processed in a spun thread form, textile form, non-woven cloth form, and other forms.

Moreover, a size of-the molded resin article is not particularly limited. That is, powder and/or fine powder of resin with a particle outer diameter of several hundreds of micrometers to several nanometers may be used.

Moreover, a combination of two or more types of resin may be molded. For example, the molded resin article having a sheet-like structure can be used in which, for example, a resin having an affinity for the sublimable organic compound is formed into a first surface layer and a lamination structure of other two or more types of resin is disposed under the first layer. Furthermore, the surface of the structure of materials other than resin may be covered with a film of the resin having the affinity for the sublimable organic compound. For example, a glass lens or plastic lens surface coated with a thin film of the resin having the affinity for the sublimable organic compound can also be used.

[Resin]

In the present invention, "resin" includes an organic compound polymer, organic polymer compound, plastics, polymer, and oligomer. It may be thermoplastic or thermosetting. Concrete examples include ketone resins, norbornane resins, polystyrenes, poly(α-methylstyrene), polyindene, poly(4-methyl-1-pentene), polyvinyl pyridines, polyacetals, polyvinyl formals, polyvinyl acetals, polyvinyl butyrals, polyvinyl acetates, polyvinyl propionates, polyvinyl alcohols, polyethylenes, polypropylenes, polybutadienes, polymethyl pentenes, polyvinyl chlorides, chlorinated polyvinyl chlorides, chlorinated polyethylenes, chlorinated polypropylenes, polyvinylidene chlorides, polytetrafluoroethylenes, polychlorotrifluoroethylenes, polyvinylidene fluorides, polyvinyl methyl ethers, polyvinyl ethyl ethers, polyvinyl benzyl ethers, polyvinyl methyl ketones, poly(N-vinylcarbazole), poly(N-vinyl pyrrolidone), polymethyl acrylates, polyethyl acrylates, polyacrylates, polyacrylonitriles, polymethyl methacrylates, polyethyl methacrylates, polybutyl methacrylates, polybenzyl methacrylates, polycyclohexyl methacrylates, polymethacrylates, polyamide methacrylates, polymethacrylonitriles, polyacetaldehydes, polychlorals, polyethylene oxides, polypropylene oxides, polyethylene terephthalates, polybutylene terephthalates, polycarbonates (bisphenols+ carbonic acid), polysulfones, polyether sulfones, polyphenylene sulfides, poly(diethylene-glycol bisarylcarbonate), 6-nylon, 6,6-nylon, 12-nylon, 6,12-nylon, polyethyl aspartiates, polyethyl glutamates, polylysines, polyprolines, poly(γ-benzyl-L-glutamate), methyl cellulose, ethyl cellulose, benzyl cellulose, hydroxyethyl cellulose, hydroxypropyl cellulose, acetyl cellulose, cellulose triacetate, cellulose tributylate, alkyd resin (phthalic anhydride+glycerin), fatty acid modified alkyd resin (fatty acid+phthalic anhydride+glycerin), unsaturated polyester resin (maleic anhydride+phthalic anhydride+propylene glycol), epoxy resins (bisphenols+epichlorohydrin), epoxy resins (cresol novolaks+epichlorohydrin), polyurethane resins, phenol resins, urea resins, melamine resins, xylene resins, toluene resins, furan resins, guanamine resins, diallylphthalate resin, and another resin, poly(phenyl methyl silane) and another organic polysilane, organic polygermane and copolymer/condensation copolymer. Examples of copolymer include acrylonitrile+styrene (AS resin), acrylonitrile+acrylate+styrene (AAS resin), acrylonitrile+ethylene+ styrene (AES resin), acrylonitrile+butadiene+styrene (ABS resin), acrylonitrile+chlorinated polyethylene+styrene (ACS resin), methylmethacrylate+butadiene+styrene (MBS resin), ethylene-vinyl chloride copolymer, ethylene-polyvinyl acetate copolymer, ethylene-vinyl alcohol copolymer and other plastics. Moreover, usable is a polymer compound obtained by plasma-polymerizing a compound usually having no polymerizing properties, such as carbon disulfide, carbon tetrafluoride, ethylbenzene, perfluorobenzene, perflyorocyclohexane and trimethyl chlorosilane.

[Sublimable Organic Compound]

Sublimation is a phenomenon in which a solid directly changes to a gas not via a liquid as an intermediate phase, and it is a general phenomenon which every solid occurs at a temperature equal to or less than a temperature at a triple point. However, for example, organic compounds such as an azo compound having a large molecular weight, and an organic compound such as ionic crystals of a polymecyne dyestuff or the like is thermally decomposed irrespective of pressure without indicating a melting point, when it is heated up to ordinary temperature or more. It can be considered that such a substance does not actually possess the triple point, so that it does not sublimate. For distinction from such a substance, an organic compound which can sublime without causing thermal composition is called "the sublimable organic compound".

As a concrete example of the sublimable organic compound, for example, the following group of compounds can be exemplified.

Examples of the sublimable and colorless organic compound include phenol derivatives such as 2,6,-di-tert-butyl-p-cresol, butylated hydroxyanisole, 2,6-di-tert-butyl-4-ethylphenol, 2,2'-methylenebis(4-methyl-6-tert-butyl phenol) and 2,2'-methylenebis(4-ethyl-6-tert-butyl phenol). These compounds are known as plastic antioxidants, and by using these to modify the resin surface layer, an oxidation preventing action of the surface layer can be strengthened. Moreover, the compound can also be used for a purpose of changing density, hardness, impact strength, modulus of elasticity, sound velocity, dielectric constant, static electricity charging order, charging properties, and refractive index of the resin surface layer without changing a molded resin article color.

Examples of a sublimable, colorless and light yellow organic compound include phenyl salicylate, p-tert-butyl phenyl salicylate, p-octylphenyl salicylate, 2,4-dihydroxybenzophenone, 2-hydroxy-4-methoxybenzophenone, 2,2'-dihydroxy-4-methoxybenzophenone, 2,2'-dihydroxy-4-4'-dimethoxybenzophenone, 2-(2'-hydroxy-5'-methylphenyl) benzotriazole, 2-(2'-hydroxy-5'-tert-butylphenyl)benzotriazole, 2-(2'-hydroxy-3',5'-di-tert-butylphenyl) benzotriazole, 2-(2'-hydroxy-3'-tert-butyl-5-methylphenyl)-5-chlorobenzotriazole, 2-(2'-hydroxy-3',5'-di-tert-butylphenyl)-5-chlorobenzotriazole, 2-[(2'-hydroxy-3'-(3",4", 5",6"-tetrahydrophthalimidemethyl)-5'-methylphenyl) benzotriazole, 2-(2'-hydroxy-5'-methacryloxyphenyl)-2H-benzotriazole and ethyl-2-cyano-3,3'-diphenyl acrylate. These compounds are known as ultraviolet ray absorbents for plastics, and by using these to modify the resin surface layer, an ultraviolet absorbing action of the surface layer can be reinforced. Moreover, the compound can also be used for the purpose of changing the-density, hardness, impact strength, modulus of elasticity, sound velocity, dielectric constant, static electricity charging order, charging properties, and refractive index of the resin surface layer without changing the molded resin article color.

Examples of the sublimable organic polymer compound for forming a single crystal exhibiting a second order nonlinear optical effect include urine and derivatives thereof, benzene derivatives such as m-nitroaniline, 2-methyl-4-nitroaniline, 2-(N,N-dimethylamino)-5-nitroacetoanilide and N,N'-bis(4-nitrophenyl)methane diamine, biphenyl derivatives such as 4-methoxy-4'-nitrobiphenyl, stilbene derivative such as 4-methoxy-4'-nitrostilbene, pyridine derivatives such as 4-nitro-3-picoline=N-oxide, chalcone derivatives such as 2',4,4'-trimethoxy chalcone, and thienyl chalcone derivatives. Since these organic compounds are colorless or yellow, they can be used to change the density, hardness, impact strength, modulus of elasticity, sound velocity, dielectric constant, static electricity charging order, charging properties, and refractive index, third-order non-linear optical susceptibility, non-linear refractive index, photorefractive effect characteristic, and the like of the resin surface layer without changing the inherent color of the resin surface layer.

Concrete examples of the sublimable organic compound (organic dyestuff) assuming light absorption in a wavelength band of ultraviolet, visible and near infrared rays include an azo dyestuff, porphyrin dyestuff, phthalocyanine dyestuff, tripherylmethane dyestuff, naphthoquinone dyestuff, anthraquinone dyestuff, naphthalene tetracarboxylic diimide dyestuff and perylene diimide tetracarbonate dyestuff. Each of these dyestuffs can be used to color the surface layer of the molded resin article. Moreover, when the dyestuff assumes fluorescence, a fluorescent assuming function can be imparted to the surface layer of the molded resin article.

Concrete examples of the sublimable azo dyestuff include azobenzene, 4-dimeth laminoazobenzene, 4-dimethylamino-3'-nitroazobenzene, 4-dimethylamino-4'-nitroazobenzene, 4-dimethylamino-3-methyl-3'-nitroazobenzene, 4-dimethylamino-3-methyl-4'-nitroazobenzene and 4-nitroazobenzene.

Concrete examples of porphyrin dyestuff include porphyrin and tetraphenyl porphyrin.

Concrete examples of the phthalocyanine dyestuff include phthalocyanine, copper phthalocyanine, cobalt phthalocyanine, nickel phthalocyanine and chloroaluminum phthalocyanine.

Concrete examples of the triphenylmethane-based dyestuff include crystal violet lactone, 3-diethylamino-6-methyl-7-chlorofluolane, 3-diethylamino-7-methylaminofluolane and 3-diethylamino-7-phenylaminofluolane.

Concrete examples of the naphthoquinone dyestuff include 1,4-naphthoquinone, 2,3-dichloro-1,4-naphthoquinone, 5-amino-2,3,-dichlorb-1,4-naphthoquinone and 8-phenylamino-5-amino-2,3-dicyano-1,4-naphthoquinone.

Concrete examples of the anthraquinone dyestuff mater include anthraquinone, 1-aminoanthraquinone and 1,4-dihydroxyanthraquinone.

Concrete examples of the nap hthalene tetracarboxylic diimide dyestuff include, naphthalene-1,4,5,8-tetracarboxylic diimide and N,N'-dimethylnaphthalene-1,4,5,8-tetracarboxylic diimide.

Concrete examples of the perylenetetracarboxylic diimide dyestuff include perylene-3,4,9,10-tetracarboxylic diimide and N,N'-di-tert-butylperylene-3,4,9,10-tetracarboxylic diimide.

Examples of a sublimable and crystalline organic compound which causes a photochromic phenomenon include spiropyrans such as 6-bromo-1',3'-dihydro-1',3',3'-trimethyl-8-nitrospiro[2H-1-benzopyran-2,2'-(2H)-indole], 5-chloro-1,3-dihydro-1,3,3-rimethylspiro[2H-indole-2,3'-[3H]naphtho[2,1-b][1,4]oxazine], 5-chloro-1,3-dihydro-1,3,3-trimethylspiro[2H-indole-2,3'-[3H]naphtho[9,10-b][1,4] oxazine], 6,8-dibromo-1',3'-dihydro-1',3',3'-trimethylspiro[2H-1-benzopyran-2,2'-(2H)-indole], 1',3'-dihydro-1',3',3'-trimethyl-6-nitrospiro[2H-1-benzopyran-2,2'-(2H)-indole], 1',3'-dihydro-5'-methoxy-1',3',3'-trimethyl-6-nitrospiro[2H-1-benzopyran-2,2'-(2H)-indole, 1',3'-dihydro-8-methoxy-1', 3',3'-trimethyl-6-nitrospiro[2H-1-benzopyran-2,2'-(2H)-indole], 1,3-dihydro-1,3,3-trimethylspiro[2H-indole-2,3'-[3H] naphtho[2,1-b][1,4]oxazine], 1,3-dihydro-1,3,3-trimethylspiro[2H-indole-2,3'-[3H]phenanthro[9,10-b][1,4] oxazine], 1,3-dihydro-1,3,3-trimethylspiro[2H-indole-2,3'-[3H]naphtho[2,1-b]pyran] and 1,3-dihydro-5-methoxy-1,3, 3-trimethylspiro[2H-indole-2,3'-[3H]naphtho[2,1-b]pyran]; fulgides such as 2,5-dimethyl-3-furilethylidene succinic anhydride and 2,5-dimethyl-3-furilisopropyridene succinic anhydride; and diaryl ethenes such as 2,3-bis(2,4,5-trimethyl-3thienyl) maleic anhydride, 2,3-bis(2,4,5-trimethyl-3-thienyl)maleimide and cis-1,2-dicyano-1,2-bis(2,4,5-trimethyl-3-thienyl)ethene. The photochromic dyestuff can be used to modify the resin surface layer, whereby photochromic characteristics can be imparted to the surface layer of the molded resin article.

Examples of the sublimable organic metal compound include metallocenes such as titanocene, vanadinocene, chromocene, manganocene, ferrocene, cobaltocene, nickelocene and ruthenocele. Each of these sublimable organic metal compounds can be used to modify the resin surface layer, whereby transmittance characteristics of an X ray or an electron ray can be changed. Moreover, since vanadinocene, chromocene, manganocene, cobaltcene and nickelocene have a magnetic moment, each of these sublimable organic metal compounds can be used to modify the resin surface layer, whereby magnetic properties can be changed.

Examples of the sublimable organic compound include dichlorophenols, trichlorophenols, tetrachlorophenols, pentachlorophenols, p-chloro-m-xylenols, p-chloro-m-cresol, 4-chloro-2-phenylphenol, 2,4,5,6-tetrachloro isophtharonitrile, 10,10'-oxybisphenoxyarsine, N-(trichloromethylthio) phthalimide and N-(fluorodichloromethylthio)phthalimide. These compounds are known as the plastic antiseptic/antifungal agent, and by using these to modify the resin surface layer, an antibacterial or antifungal function can be imparted to the resin surface layer. By using the modification method of the surface layer of the molded resin article, as compared with a case in which the antiseptic/antifungal agent is kneaded into the entire plastic, the use amount of the antibacterial/antifungal agent can be minimized.

Similarly, by using the organic compound having a medicinal activity as the sublimable organic compound to modify the resin surface layer, a function as a medicine and/or agricultural chemical can be imparted to the resin surface layer. For example, a medicine function such as a pain relieving action can be imparted to the surface layer of a molded resin article such as a plastic film by using L-menthol (melting point of 43° C.), and another medicine function such as a cardiotonic action can be imparted to the above surface layer by using camphor (melting point of 179° C.). Similarly, for example, the surface layer of a plastic sheet can be provided with agricultural chemical functions such as a weed killing function, insect killing function, harmful insect inhibiting/avoiding function, plant growth promoting function, and plant growth inhibitor.

As the sublimable and crystalline organic compound, 3,4-dimethoxybenzaldehyde (melting point of 40° C.), 3-oxy-2-methyl4-pyron (melting point of 161° C.) and the like can be exemplified. These compounds are used as perfumes, and when the resin surface layer is modified with any of these compounds, a function of generating a strong perfume can be imparted to the resin surface layer.

EXAMPLE

Next, the method of the present invention will be described in more detail in accordance with examples.

Example 1

Figure 2A:
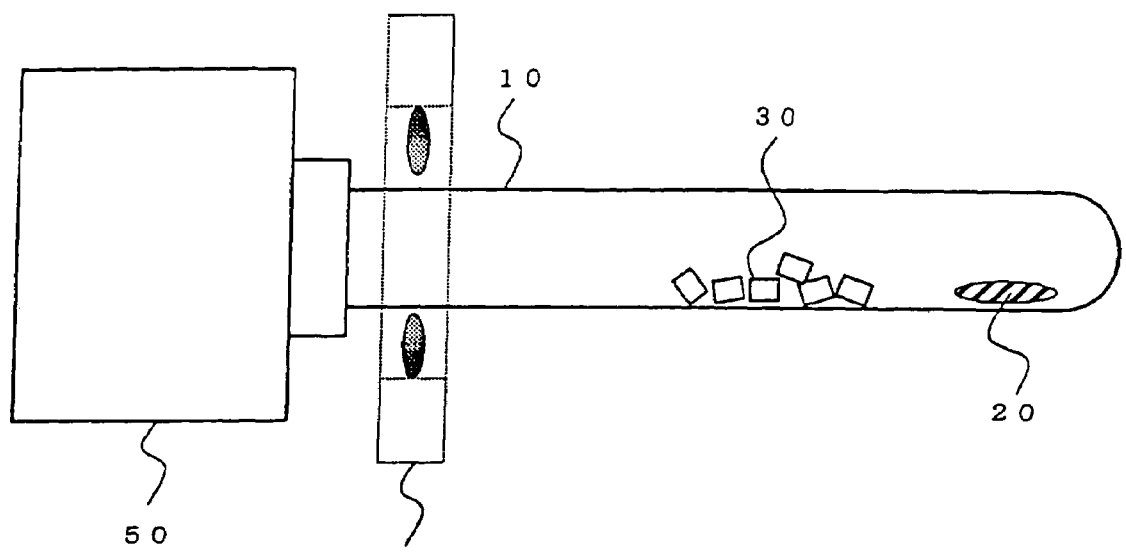
FIG. 2(A) is a sectional view showing a schematic constitution of an apparatus for connecting an end of a glass tube to a vacuum exhaust apparatus to reduce a pressure in the tube at room temperature.
Figure 2B:
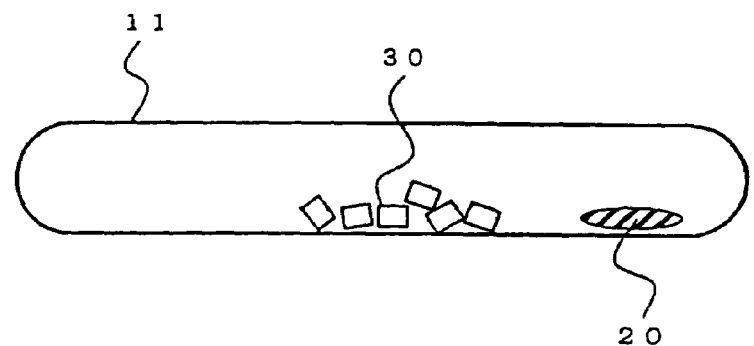
FIG. 2(B) is a diagram showing the glass tube tightly closed by melting and sealing a tube portion in the vicinity of the glass tube connection end.

As shown in FIG. 1, in a glass tube 10 (e.g., outer diameter=15 mm, inner diameter=12 mm, and length=200 mm) having one closed end, there were placed 5 mg of crystals of cis-1,2-dicyano-1,2-bis(2,4,5-trimethyl-3-thienyl)ethene (melting point of 121° C.; manufactured by Tokyo Kasei Kogyo Co., Ltd.) as an organic compound 20 having sublimation properties and an affinity for a resin of a molded resin article to be coated, and five or six pellets (cylindrical shape, outer diameter=about 2.5 mm, and a length=2.5 mm) of bisphenol A polycarbonate (manufactured by Ardrich Chemical Co., Ltd.) as molded resin articles. Thereafter, as shown in FIG. 2(A), the other end of the glass tube 10 was connected to a vacuum exhaust apparatus 50, and air was exhausted at room temperature until a pressure in the tube reached $10^{-5}$ Pa or less. Subsequently, as shown in FIG. 2(B), a portion close to the connection end of the glass tube 10 was molten and sealed with a glass tube sealing burner 60, and the organic compound and resin pellets were put in a sealed glass tube 11 having both the sealed ends, followed by sealing the tube in an airtight manner.

Figure 3:
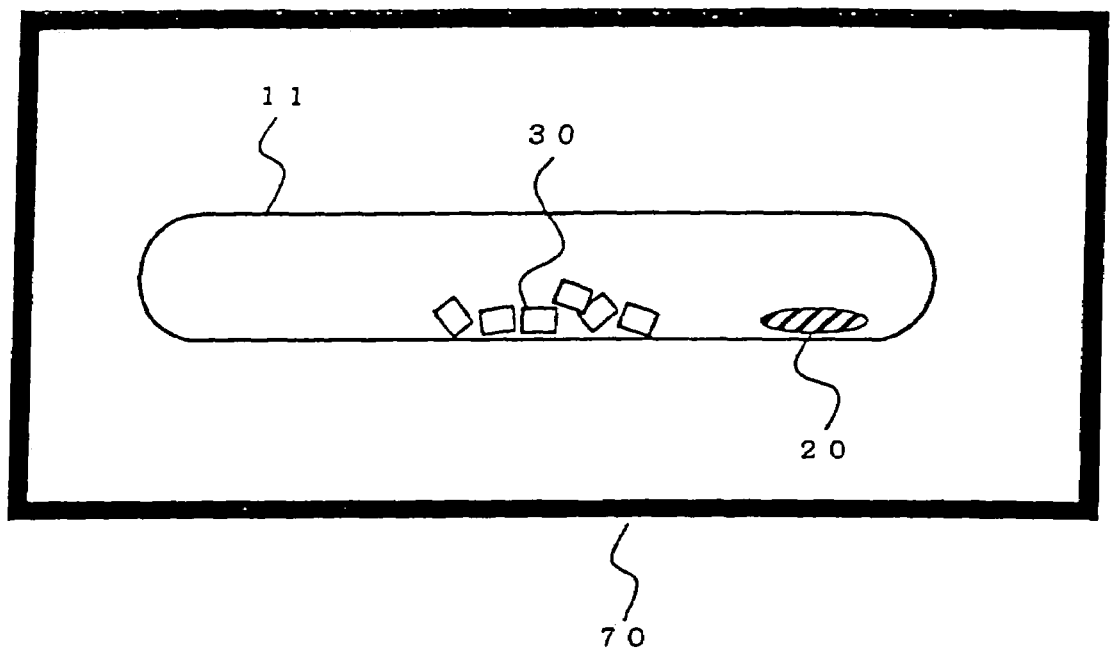
FIG. 3 is a sectional view showing a schematic constitution of the modification/coloring apparatus for the resin surface layer in one step of the modification/coloring method of the resin surface layer in Example 1.

Next, as shown in FIG. 3, the sealed glass tube 11 was disposed in a thermostatic chamber 70, and the entire sealed glass tube 11 was heated under precise temperature control by setting a temperature at which the sublimable organic compound sublimes without thermal decomposition (110° C. in the case of the above-mentioned compound) as a lower limit, and setting a highest temperature among temperatures satisfying the following conditions as an upper limit.

(a) A temperature which does not exceed a melting start temperature of the sublimable organic compound, (b) a glass transition temperature of the resin (about 150° C. with polycarbonate), (c) a thermal deformation start temperature of the resin, (d) a melting start temperature of the resin, (e) a temperature which does not exceed a decomposition start temperature of the resin.

Additionally, when carrying out the resin surface layer modification method and/or coloring method of the present invention without losing a surface smoothness of the molded resin article or a fine structure in the surface, temperature control needs to be performed not to exceed the thermal deformation start temperature of the resin.

In the present example, an inside temperature of the thermostatic chamber 70 was set to 110° C., and the set temperature was maintained with a precision of ±0.1° C. for 24 hours. Thereafter, the temperature of the thermostatic chamber 70 was gradually lowered to 25° C. for nine hours. Additionally, here, for example, when the sealed glass tube 11 is taken out of the thermostatic chamber and rapidly cooled, a vapor of the sublimable organic compound contacts the inner wall of the cooled sealed glass tube 11 and agglomerates, and is deposited as crystals, and there is a possibility that a predetermined amount of the sublimable organic compound does not uniformly penetrate/disperse into the resin surface layer.

Figure 10:
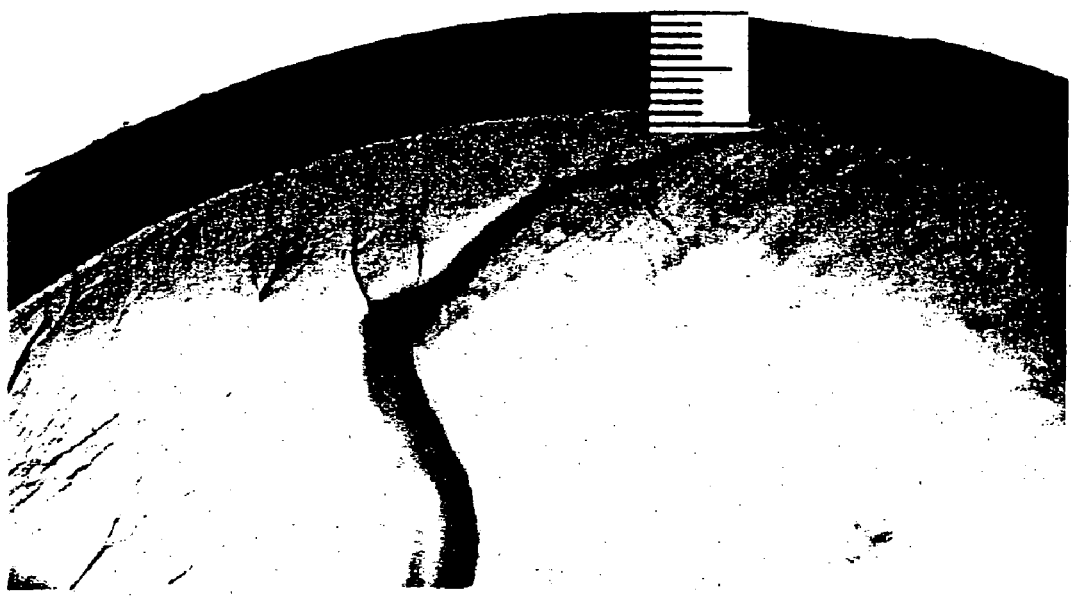
FIG. 10 is a diagram showing a situation in which a section of a resin pellet obtained in Example 1 is enlarged by an optical microscope and observed. One scale graduation in the drawing is 10 μm.

In the present example, by gradually performing cooling to room temperature, taking out the cooled sealed glass tube 11, and cutting the sealed glass tube 11, the polycarbonate pellet was taken out in which the sublimable organic compound penetrated/dispersed into the surface layer. The pellet was cut into round pieces with a cutter and observed with an optical microscope, and a section photograph was taken as shown in FIG. 10. One graduation of a scale inserted into FIG. 10 is ten micrometers. As apparent from FIG. 10, it has been understood that the sublimable organic compound penetrates/disperses from the surface of the polycarbonate pellet into the surface layer over a depth of about 90 micrometers, whereby the surface layer is modified/colored.

Furthermore, by measurement of light absorption spectrum of the obtained resin surface layer, optical microscope observation (usual field of view), polarization microscope observation, scanning type electron microscope observation of the surface of the resin pellet, and transmission electron microscope observation of the resin pellet section, it was confirmed that the molecules of the sublimable organic compound were dispersed, i.e., dissolved into the resin pellet, whereby the surface layer was modified/colored. Additionally, any crystals of the sublimable organic compound were not observed in the surface and the inside part of the obtained resin pellet.

It was observed that the polycarbonate surface layer modified/colored by the penetration of the sublimable organic compound, cis-1,2-dicyano-1,2-bis(2,4,5-trimethyl-3-thienyl)ethene turned to yellow by the irradiation of a visible ray from which an ultraviolet ray was cut and/or an infrared ray, and turned to red by the irradiation of the ultraviolet ray. That is, it was confirmed that a photochromic function was imparted to the resin surface layer.

FIG. 3 shows a simplest embodiment of a resin surface layer modification and/or a coloring apparatus of the present invention. That is, in the glass tube 11 having both the sealed ends, the molded resin article (resin pellet 30), and the organic compound 20 having an affinity for the molded resin article and sublimation properties are disposed. In the glass tube 11, the organic compound is brought to the saturated sublimation pressure state. Moreover, the thermostatic chamber 70 is heating means for sublimating the organic compound, depositing the vapor of the organic compound on the surface of the molded resin article, and allowing the-organic compound to penetrate/disperse into the molded resin article.

Comparative Example 1

A sealed glass tube 11 was heated and slowly cooled by the same procedure as in Example 1 except that in a glass tube 10 having one end closed (e.g., outer diameter=15 mm, inner diameter=12 mm, and length=200 mm), there were placed, for example, crystals only of cis-1,2-dicyano-1,2-bis(2,4,5-trimethyl-3-thienyl)ethene as an organic compound 20 having sublimation properties and an affinity for a resin of a molded resin article to be coated. The vapor of the sublimable organic compound sublimated and generated during the heating returned to the surface of the original crystals during the slow cooling, so that the vapor was not deposited on the glass wall of the glass tube 11. Additionally, when the sealed glass tube 11 in a hot state was removed from a thermostatic chamber and rapidly cooled, the vapor of the sublimable organic compound came in contact with the inner wall of the cooled glass sealed tube 11, so that the vapor agglomerated and the organic compound was deposited as crystals on the inner wall of the sealed glass tube 11. In view of the fact that the crystals are deposited on the inner wall of the sealed glass tube in this manner by the rapid cooling, it has been understood that the sublimation proceeds by the heating, so that the sealed glass tube is filled with the vapor of the sublimable organic compound.

Example 2

2.0 g of Polymethyl methacrylate (PMMA) was dissolved in 200 ml of aceton. The resultant solution was added to 800 ml of n-hexane with stirring, and a deposited resin powder was then collected by filtration. This resin powder was washed with n-hexane, dried under reduced pressure, and then pulverized. The thus obtained resin powder was continuously heated at 100° C. under ultrahigh vacuum less than $10^{-5}$ Pa for two days to completely remove volatile components such as a remaining solvent and the like. Subsequently, 100 mg of this powder was interposed together with a thick spacer having a thickness of 10 μm between the glass substrate (thickness=0.14 mm, width=10 mm, and length=20 mm) and an aluminum foil (thickness=20 μm, width=10 mm, and length=20 mm), and another glass plate was further superposed on the aluminum foil. The two glass plates were heated at 150° C. under vacuum, and then pressed (vacuum hot press method) to thereby prepare a PMMA film (film thickness=about 100 μm) between the glass substrate and the aluminum foil. Subsequently, after sufficient cooling, the aluminum foil was stripped, so that a PMMA thin film 33 was obtained on a glass substrate 40.

In the glass tube 10 having one closed end (e.g., outer diameter=15 mm, inner diameter=12 mm, and length=200 mm), there were placed 20 mg of crystals of cis-1,2-dicyano-1,2-bis(2,4,5-trimethyl-3-thienyl)ethene as an organic compound 20 having sublimation properties and an affinity for a resin of a molded resin article to be coated, and the glass substrate on which the above resin thin film 33 was formed. Next, the other end of the glass tube 10 was connected to a vacuum exhaust apparatus 50, and air was exhausted at room temperature until the pressure in the tube reached $10^{-5}$ Pa or less. Thereafter, a portion close to the connection end of the glass tube 10 was molten by a glass tube sealing burner 60, followed by sealing the tube, whereby the organic compound and the resin thin film were airtightly confined in a sealed glass tube 11 having both the sealed ends.

Figure 4:
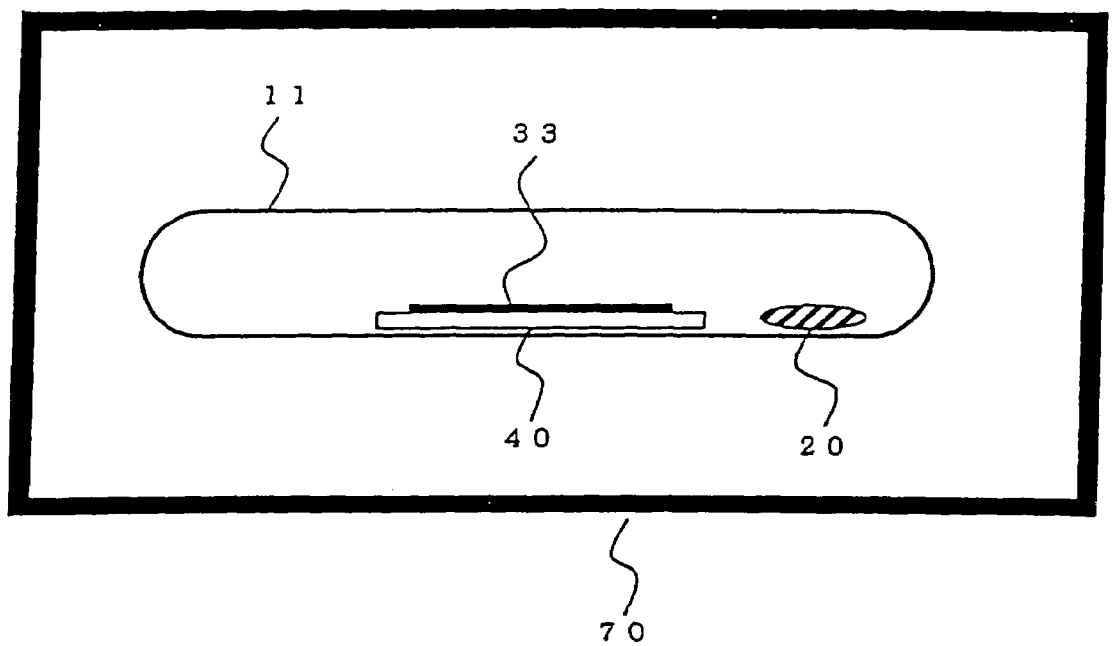
FIG. 4 is a sectional view showing a schematic constitution of the modification/coloring apparatus for the resin surface layer in the modification/coloring method of the resin surface layer in Example 2.

As shown in FIG. 4, the sealed glass tube 11 was disposed in a thermostatic chamber 70, and the sealed glass tube 11 was wholly heated at a temperature (110° C. in the case of the above-mentioned compound) at which the above sublimable organic compound sublimed without thermal decomposition, while the above temperature was strictly controlled. After 5 hours, the temperature of the thermostatic chamber 70 was gradually lowered to 25° C. in 9 hours.

According to the light absorption spectrum measurement, optical microscope observation (usual visual field) and polarization microscope observation of the obtained resin surface layer, the scanning type electron microscope observation of the resin thin film surface, and the transmission type electron microscope observation of the resin thin film section, it was confirmed that the molecule dispersion, i.e., dissolution of the sublimable organic compound occurred over a depth of about 20 micrometers in the surface layer of the resin thin film 33. Additionally, any crystals of the sublimable organic compound were not observed on and inside the obtained resin thin film. That is, it has been understood that the sublimable organic compound penetrates and disperses through the surface of the PMMA resin thin film 33 formed on the glass substrate 40 to modify and color the surface layer (thickness=20 μm).

Figure 11:
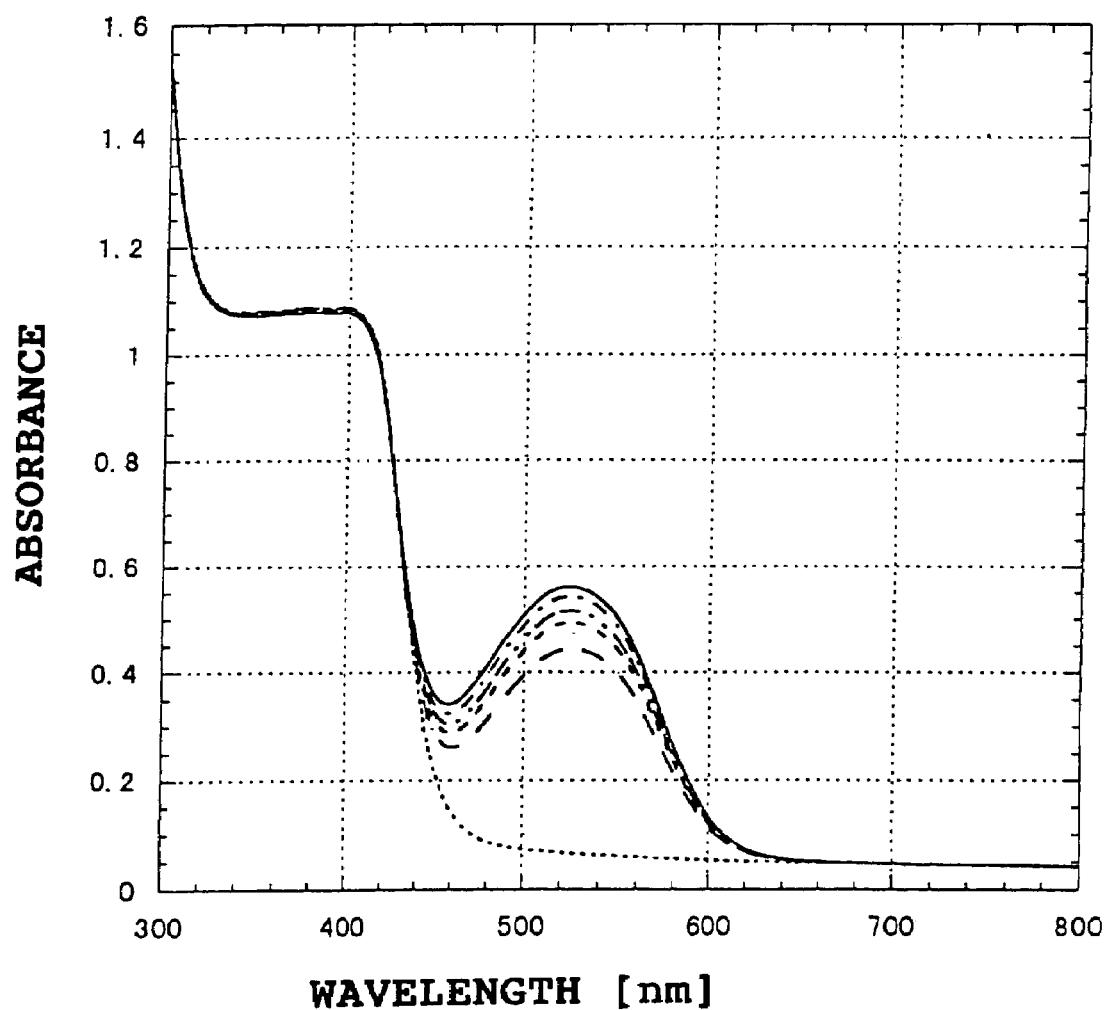
FIG. 11 is a diagram showing a spectrum change when a photochromic resin thin film prepared in, Example 2 is irradiated with an ultraviolet ray.

The polycarbonate resin thin film modified with cis-1,2-dicyano- 1,2-bis(2,4,5-trimethyl-3-thienyl)ethene prepared in the present example turns to yellow by the irradiation of the visible ray from which an ultraviolet ray is cut and/or an infrared ray, and turns to red by the irradiation of the ultraviolet ray. That is, it was confirmed that the above thin film functioned as a photochromic thin film. The film irradiated with the visible ray obtained by cutting light of a wavelength less than 400 nm and the infrared ray and changed to yellow was irradiated with the ultraviolet ray (center wavelength=366 nm) of a black light for 2, 4, 6, 8, 10 hours, and a result of measurement of an absorption spectrum change is shown in FIG. 11. The spectrum of 20 minutes after the irradiation of the visible ray of a wavelength of 400 nm or more and infrared ray is shown by a dotted line, the spectrum of two hours after the irradiation of the ultraviolet ray is shown by a long chain line, the spectrum after four hours is shown by a short chain line, the spectrum after six hours is shown by a two-dot chain line, the spectrum after eight hours is shown by a dashed line, and the spectrum after ten hours is shown by a solid line.

Example 3

Besides the PMMA substrate in Example 2, the glass substrate 40 having the resin thin film 33 (film thickness of 100 μm) formed on the glass substrate 40 (e.g., thickness=0.14 mm, width=10 mm, and length=50 mm) was prepared with poly(2-hydroxypropyl methacrylate) (PHPMA) by a vacuum hot press method. Subsequently, two glass substrates 40 with different types of resin thin films formed thereon were placed in the same sealed glass tube 11, and together with the organic compound 20 having the sublimation properties and an affinity for a resin of the molded resin article to be coated, similarly as Example 2, heating and slow cooling were performed. As a result of spectrum observation, it was confirmed that the sublimable organic compound was dissolved in the PMMA thin film similarly as Example 2 and that the surface layer was modified/colored. On the other hand, no absorption attributed to the sublimable organic compound was confirmed in the ultraviolet, visible and infrared ray absorption spectra of the obtained PHPMA thin film. This result can be interpreted such that the sublimable organic compound has an affinity for PMMA, but no affinity for PHPMA. Moreover, when there is no affinity, penetration/dispersion into the resin thin film does not occur.

Comparative Example 2

With respect to the sealed glass tube 11 which contained only the resin thin film 33 (film thickness of 100μ) formed of poly(2-hydroxypropyl methacrylate) (PHPMA) on the glass substrate 40 (e.g., thickness=0.14 mm, width=10 mm, and length=50 mm) by the vacuum hot press method, together with the organic compound 20 having the sublimation properties and an affinity for a resin of the molded resin article to be coated, similarly as Example 2, heating and slow cooling were performed. As a result of spectrum observation, no absorption attributed to the sublimable organic compound was confirmed in the absorption spectrum of the obtained PHPMA thin film.

As described above, from the observations of Examples 1, 2 and 3, and Comparative Examples 1 and 2, it has been confirmed that during heating in the sealed glass tube with the reduced pressure, the sublimable organic compound is sublimes, the glass tube is filled with a vapor, and the vapor deposition process proceeds on cooling the vapor. Furthermore, when the heated state is kept without cooling, and the molded resin article (the pellet or the resin thin film) having an affinity for the sublimable organic compound is placed in the state, the molecule dispersion/dissolving of the sublimable organic compound occurs in the resin surface layer and the surface layer is modified and/or colored. On the other hand, it has been confirmed that in the absence of the molded resin article having an affinity for the sublimable organic compound, the sublimable organic compound once sublimes, but by slow cooling, the sublimable organic compound vapor returns to the crystal surface.

Here, the affinity of the sublimable organic compound for the resin can be understood as "presence/absence of stabilization by solvation energy". That is, the resin herein serves as "a medium" for the sublimable organic compound, and serves as "a solvent" for a solution. In a case in which no affinity of the sublimable organic compound for resin is recognized, resin serves as "medium with zero solubility". In this case, since "there is no stabilization by the solvation energy", the sublimable organic compound vapor cannot penetrate/disperse into the resin. Therefore, heating is performed to provide the saturated vapor pressure state, slow cooling is then performed, and the sublimable organic compound vapor returns again to the crystal surface to crystallize, which is a most thermodynamic stabilized state. On the other hand, when "there is stabilization by the solvation energy", the sublimable organic compound vapor having reached the resin surface is not again vaporized. Because there is more stabilization when the vapor is dissolved into resin rather than when the vapor returns to the crystal surface. In other words, when "there is stabilization by the solvation energy", the "dissolution" into the resin from the crystal surface proceeds via vacuum. Additionally, similarly as searching the solvent suitable for recrystallization refining, "the presence/absence of the affinity" needs to be searched after repeated trial and error based on rules of thumb such as similarity of molecular part structure and solubility parameter. In this case, it is also possible to use a calculation chemistry technique.

Example 4

After preparing three glass tubes 10 having one end closed (outer diameter=15 mm, inner diameter=12 mm, and length=200 mm), disposing 20 mg of cis-1,2-dicyano-1,2-bis(2,4,5-trimethyl-3-thienyl)ethene as the organic compound 20 having the sublimation properties and an affinity for a resin of the molded resin article to be coated, and five or six pellets 30 (cylindrical shape, outer diameter=about 2.5 mm, and a length=2.5 mm) of bisphenol A polycarbonate (manufactured by Ardrich Chemical Co., Ltd.) as the molded resin article in each of the tubes, and connecting the other end of the glass tube 10 to the vacuum exhaust apparatus 50, exhaustion was performed at room temperature until the pressure in the tube reached $10^{-5}$ Pa or less. Thereafter, the portion close to the connection end of the glass tube was molten and sealed with the glass tube sealing burner 60, and the organic compound and the molded resin article were placed in the sealed glass tube 11 with both the sealed ends in the airtight manner.

Each of the three sealed glass tubes 11 was placed in the thermostatic chamber 70, and the entire sealed glass tube 11 was heated under strict temperature control at the temperature (110° C. in the case of the above-mentioned compound) in which the sublimable organic compound sublimed without thermal decomposition. The heating time was set to 12 hours, 24 hours, 48 hours for the respective three. After the heating ended, the temperature of the thermostatic chamber 70 was gradually lowered to 25° C. for nine hours. In any case, the crystals of the sublimable organic compound remained.

For each of three types of the resin pellets in which the heating treatment time was set to 12, 24 and 48 hours, the optical microscope observation of section was made, and as a result, the depth of the penetration/dissolution of the sublimable organic compound was 55 μm, 100 μm and 190 μm from the pellet surface in accordance with the heating treatment time. That is, it has been understood that when a sufficient amount of sublimable organic compound exists, the depth of penetration/dissolution of the sublimable organic compound, i.e., the thickness of the surface layer to be modified can be controlled in accordance with the heating treatment time. Additionally, needless to say, the thickness of the surface layer to be modified can also be controlled by controlling a charge amount of the sublimable organic compound to the molded resin article.

Example 5

Figure 5:
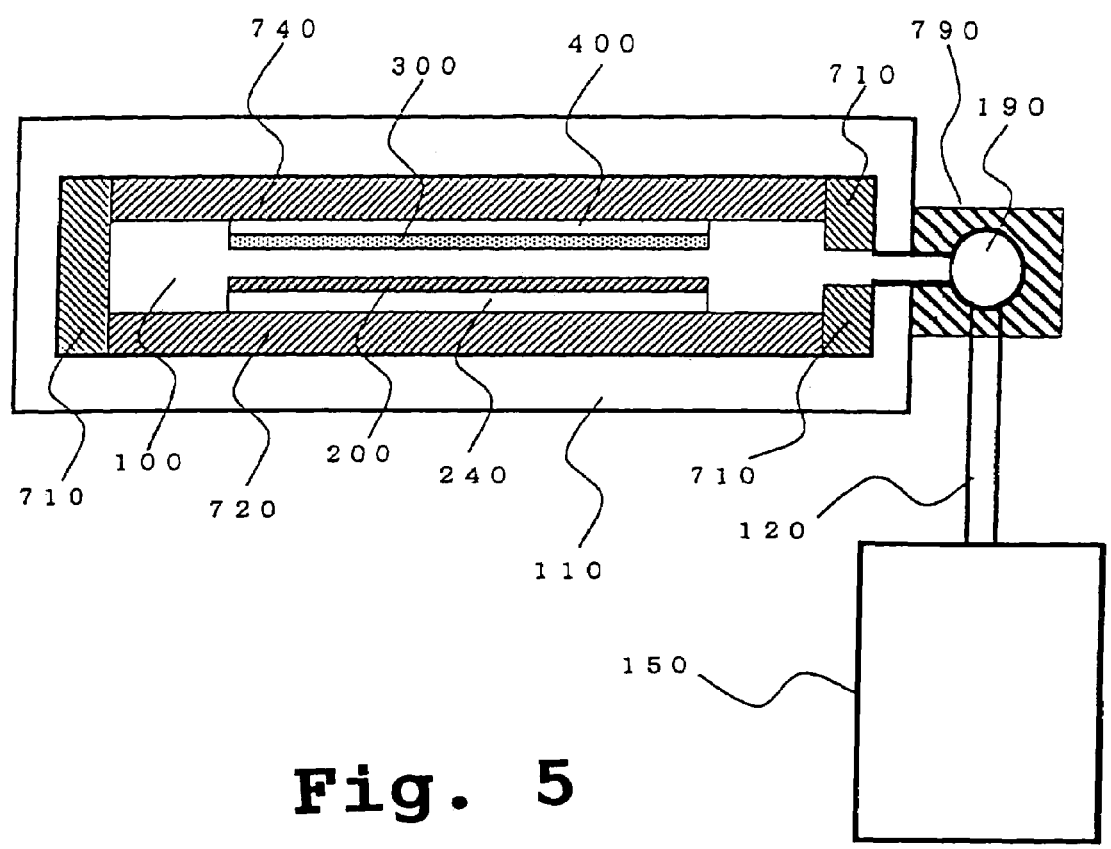
FIG. 5 is a sectional view showing a schematic constitution of the modification/coloring apparatus for the resin surface layer in the modification/coloring method of the resin surface layer in Example 5.

FIG. 5 is a sectional view showing a schematic constitution of a resin surface layer modification and/or coloring apparatus of the present example.

Used as the molded resin article was a resin film 300 (film thickness of 1 μm) obtained by coating one surface of a circular glass substrate 400 (e.g., a diameter of 120 mm, a thickness of 0.6 mm) with a dichloromethane solution of polycarbonate resin by a spin coat method, and performing a deaeration treatment at 150° C. for two hours under high vacuum of $10^{-5}$ Pa.

On the other hand, by forming a film of sublimable organic compound (e.g., cis-1,2-dicyano-1,2-bis(2,4,5-trimethyl-3-thienyl)ethene) on a sublimation source substrate 240 (aluminum plate, for example, with a diameter of 120 mm, thickness of 2 mm) by a melting method, a sublimation source was prepared.

Moreover, the sublimation source was disposed opposite to the resin film 300. A surface interval between the resin film 300 and a formed sublimable organic compound film 200 was set, for example, to 5 mm. When the surface interval is shorter, the vapor of the sublimable organic compound generated from the sublimation source reaches the resin film surface in a shorter time. However, if this interval is set to be extremely short, exhaust resistance increases during pressure reduction in a tightly closable container. An interval of the order of 1 mm to 10 mm is preferable.

A tightly closable container outer wall 110 is formed of stainless steel or aluminum, and is structured (not shown) to be vertically dividable in order to place or remove the substrate.

A tightly closable container interior 100 is connected to a vacuum exhaust system 150 via a vacuum valve 190 and a vacuum pipe 120, and the valve 190 is closed after performing exhausting to obtain a pressure of $10^{-5}$ Pa or less in the tightly closable container interior 100 at room temperature. Thereby, the tightly closable container is closed.

A heater 710 as heating means, sublimation source substrate heater 720, resin film glass substrate heater 740, and vacuum valve heater 790, for example, formed of aluminum with a sheath electric heating line embedded therein can be used. By disposing the heaters of materials high in conductivity without any gap, the portions of the tightly closable container interior 100 and vacuum valve 190 can uniformly be heated. Here, if a place lower in temperature than other places exists in a part of the tightly closable container interior 100 and/or the vacuum valve 190, the sublimable organic compound vapor generated by sublimation is cooled by the part, and possibly crystallized/deposited, and attentions are therefore necessary.

For the sublimation source substrate 240 and sublimation source substrate heater 720, and the circular glass substrate 400 and resin film glass substrate heater 740, the substrate is closely attached to the heater via a plurality of holding clicks (not shown).

In the present example, the pressure of the tightly closable container interior 100 was reduced, and it was then heated by the heating means. At this time, temperature control was precisely performed so that the whole of the interior 100 might be a set temperature (e.g., 110° C.)±1° C.

After continuing the heating at the set temperature for 24 hours, the heating was stopped, and the temperature of the tightly closable container interior was gradually lowered to 25° C. in 12 hours. Subsequently, after returning the tightly closable container interior to atmospheric pressure, the resin film 300 on the circular glass substrate 400 was removed.

By measurement of light absorption spectrum of the obtained resin film 300, optical microscope observation (usual field of view), polarization microscope observation, scanning type electron microscope observation of the resin thin film surface, and transmission electron microscope observation of the resin thin film section, it was confirmed that the molecule dispersion and dissolution of the sublimable organic compound occurred inside the resin film 300, and the surface layer was modified/colored. Moreover, any crystals of the sublimable organic compound were not observed in the surface and the inside portion of the obtained resin film.

In the present example, the tightly closable container interior 100 was subjected to pressure reduction and the heating was then performed. However, the heating under vacuum using the heater proceeds only by "radiant heat", and therefore it cannot be said that the example is efficient. Particularly, in order to closely attach the circular glass substrate 400 and sublimation source substrate 240 large in area to the resin film glass substrate heater 740 and sublimation source heater 720 for improvement of heat conduction, it is necessary to apply a heat conductive silicone grease or the like. In order to enhance efficiency of the heating process without using the grease, after uniformly heating the tightly closable container interior 100, tightly closable container outer wall 110, and vacuum valve 190 to a predetermined temperature under atmospheric pressure, the pressure of the tightly closable container interior 100 may be reduced-to a predetermined pressure. During heating under atmospheric pressure, if there is a possibility that the resin or the sublimable organic compound is oxidized/deteriorated by oxygen in air, the heating may be performed after replacing the atmosphere in the tightly closable container interior 100 with inactive gases such as a nitrogen gas and argon gas. When the heating is performed under atmospheric pressure, a gas amount is large as compared with the amount during pressure reduction, and therefore the entire tightly closable container interior can uniformly be heated by convection of a gas molecule.

Additionally, when a method of performing the pressure reduction after the heating is employed, and when a time necessary for performing the pressure reduction to obtain the predetermined pressure is long, the sublimation from the sublimable organic compound starts, and a part thereof escapes to the vacuum exhaust system 150. To minimize such loss, the time necessary for performing the pressure reduction to obtain the predetermined pressure needs to be shortened as much as possible. For that, the exhaust resistance of the vacuum valve 190 and vacuum pipe 120 is reduced, and further high-efficiency vacuum pumps such as a turbo molecule pump may be used in the vacuum exhaust system.

When a technique of performing the pressure reduction after the heating is used, and when holes of porous particles such as silica gel, diatomaceous earth, and zeolite are impregnated with the sublimable organic compound beforehand for use, much time is required to allow the subliming vapor to disperse into the tightly closable container from the holes, and it is therefore possible to reduce loss in a pressure reduction process.

During use of the technique of performing the pressure reduction after the heating, when sublimation starts, "sublimation heat" is taken from the sublimation source in accordance with an amount of a subliming vapor. To compensate for the heat, it is necessary to continue the heating of the sublimation source, and carefully perform the temperature control. In general, since the sublimation does not rapidly proceed like boiling, even with the heating under vacuum, there is little possibility of causing delay in supply of the sublimation heat.

During high-speed exhausting of the tightly closable container interior, devising needs to be performed so as to prevent the sublimable organic compound from dispersing. If the powder of sublimable organic compound is deposited on the surface of the molded resin article, the sublimable organic compound powder directly penetrates into the resin film, and there is a possibility that uniformity of penetration/dispersion of the sublimable organic compound into the resin film is deteriorated.

In order to prevent the sublimable organic compound from dispersing, the "sublimation source" formed of any one of the following constitutions may be used.

(A) A film coated with or formed of the sublimable organic compound alone on the surface of the sublimation source substrate, (B) a film coated with or formed of the sublimable organic compound and a binder resin on the surface of the sublimation source substrate, (C) a film coated with or formed of the porous particle impregnated with the sublimable organic compound on the surface of the sublimation source substrate, (D) a film coated with or formed of the porous particle impregnated with the sublimable organic compound and the binder resin on the surface of the sublimation source substrate, and (E) holes in the surface of a porous sublimation source substrate (e.g., anodized-aluminum plate) impregnated with the sublimable organic compound.

When the binder resin is used for the film formation, in principle, it is preferable to select and use the resin which has no affinity for or no compatibility with the sublimable organic compound and which allows the sublimable organic compound to disperse as crystals or fine particles. This is because if the sublimable organic compound is dissolved in the binder resin, the "sublimation" in a strict meaning does not occur.

When the coating method is employed for the film formation, sufficient care needs to be taken in order to prevent the solvent from remaining in the coated film. In a case in which the solvent is used, the remaining solvent in the coated film has to be removed on a condition that the sublimable organic compound is prevented from subliming. This is not easy, and it is therefore preferable to employ the coating method in which no solvent is used if possible, for example, in which a ultraviolet-curing resin or an electron beam curing resin is used.

In a compound in which the sublimable organic compound is easily molten, a method is recommended in which melting and film formation are performed on the sublimation source substrate without any solvent.

When the sublimable organic compound is an easily molten compound, the holes in the porous particle or the porous substrate can be impregnated without any solvent. For example, the following melting method can be used. That is, after charging an appropriate amount of porous particles and fine powder of sublimable organic compound into the tightly closable container provided with the vacuum valve, and continuing deaeration in room temperature, air in the holes of the porous particles is removed. Thereafter, by tightly closing the tightly closable container, and performing the heating, the sublimable organic compound is molten. Subsequently, when the inactive gas is gradually introduced into the tightly closable container still in the molten state, the molten sublimable organic compound penetrates into the holes of the porous particles. Subsequently, by performing cooling, and subsequently pulverizing a block of the porous particles condensed by the sublimable organic compound and impregnated with the sublimable organic compound, the porous particles impregnated with the sublimable organic compound, which have desired particle diameters, are obtained. By using the porous substrate instead of the porous particles to perform the similar process, and finally scraping the deposited sublimable organic compound from the surface of the porous substrate, the porous substrate impregnated with the sublimable organic compound can be obtained.

Example 6

Figure 6:
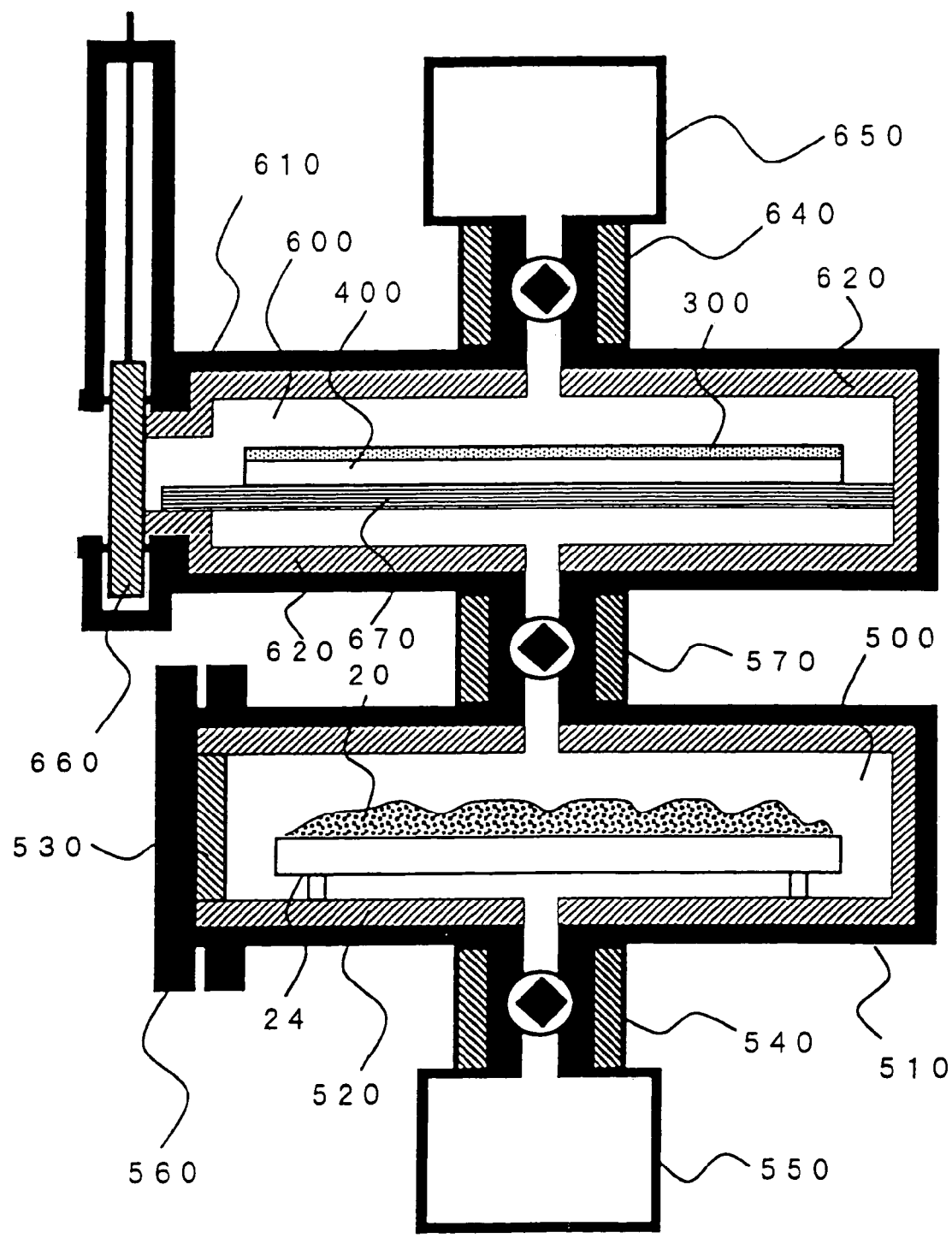
FIG. 6 is a sectional view showing a schematic constitution of the modification/coloring apparatus for the resin surface layer in the modification/coloring method of the resin surface layer in Example 6.

FIG. 6 is a sectional view showing a schematic constitution of a resin surface layer modification and/or coloring apparatus of the present example.

As the organic compound 20 having the sublimation properties and an affinity for a resin of the molded resin article to be coated, cis-1,2-dicyano-1,2-bis(2,4,5-trimethyl-3-thienyl)ethene was placed in a tray 24, and introduced into a first vacuum container 510 via a vacuum door 560. By closing the vacuum door 560, and vacuum valves 540 and 570, the interior of the first vacuum container 510 turns to a first closed space 500.

On the other hand, the resin film 300 (film thickness of 1 µm) obtained as the molded resin article by coating one surface of the circular glass substrate 400 (e.g., a diameter of 120 mm, a thickness of 0.6 mm) with the dichloromethane solution of polycarbonate resin by the spin coat method, and performing the deaeration treatment at 150° C. for two hours under high vacuum of $10^{-5}$ Pa was introduced into a second vacuum container 610 via a gate valve 660 by utilizing a transport rail 670. By closing the gate valve 660, and vacuum valves 640 and 570, the interior of the second vacuum container 610 turns to a second closed space 600.

There was controlled the heating by a heater 620 attached to the entire surface of the inner wall of the second vacuum container 610, gate valve 660 provided with a heater, and vacuum valves 640 and 570 provided with heaters, whereby the temperature in the second closed space 600 was controlled to 110° C., i.e., the same temperature as in the first closed space 500.

Moreover, there was controlled the heating by a heater 520 attached to the entire surface of the inside wall of the first vacuum container 510, a heater 530 for the vacuum door 560, and vacuum valves 540 and 570 provided with the heaters, whereby the temperature in the first closed space 500 was controlled to 110° C., i.e., the same temperature as in the second closed space 600. As described in Example 1, the sublimable organic compound sublimes in 110° C. without thermal decomposition.

By opening the vacuum valve 540 attached to the first vacuum container 510 to connect a vacuum exhaust system 550, the pressure in the first closed space 500 was brought to the saturated sublimation pressure state of the sublimable organic compound, and subsequently, the vacuum valve 540 was closed. Additionally, when the vacuum valve 540 is kept to be open, the sublimable organic compound vapor escapes into the vacuum exhaust system 550. Therefore, in order to compensate for drop of pressure reduction degree by leak from each portion of the vacuum apparatus, control was performed by sometimes opening the vacuum valve 540 in such a manner that the pressure in the first closed space 500 reached the saturated sublimation pressure of the sublimable organic compound.

On the other hand, by opening of the vacuum valve 640 provided with the heater attached to the second vacuum container 610 to connect a vacuum exhaust system 650, the pressure in the second closed space 600 was set to be equal to or less than the saturated sublimation pressure of the sublimable organic compound at the temperature (110° C.). Thereafter, the vacuum valve 640 was closed, and in order to compensate for the pressure reduction degree drop by the leak from each vacuum apparatus portion, by in such a manner that the pressure in the second space 600 became equal to or less than the saturated sublimation pressure of the sublimable organic compound.

Subsequently, by opening the vacuum valve 570, provided with the heater, for separating the first vacuum container 510 from the second vacuum container 610, and connecting the first closed space 500 to the second closed space 600, the first closed space 500 and second closed space 600 were combined to form a third closed space. Furthermore, the temperature and pressure were controlled in such a manner that the entire third closed space was brought to the saturated sublimation pressure state of the sublimable organic compound. In this manner, the sublimable organic compound vapor with which the first closed space 500 before the connection was filled and dispersed into the second closed space 600 before the connection. In this case, by slightly opening the vacuum valve 640 to the vacuum exhaust system 650 from the second vacuum container 610, and controlling the pressure in the second vacuum container 610 to be lower than that in the first vacuum container 510, the process of allowing the sublimable organic compound vapor to disperse into the second vacuum container 610 from the first vacuum container 510 is promoted. However, if the vacuum valve 640 is kept to be open, the sublimable organic compound vapor escapes to the vacuum exhaust system 650.

As described above, the temperature and the pressure are controlled to the predetermined levels, whereby the sublimable organic compound vapor generated in the first vacuum container 510 is uniformly deposited on the surface of the molded resin article placed in the second vacuum container 610, and the deposited sublimable organic compound can penetrate/disperse from the surface of the molded resin article into its inside. After continuing this process for a predetermined time, for example, ten minutes, and closing the vacuum valve 570 provided with the heater for separating the first vacuum container 510 from the second vacuum container 610, the vacuum valve 640 was opened to exhaust the remaining sublimable organic compound vapor from the second vacuum container 610. Subsequently, after cooling the temperature of the second vacuum container 610 in the vicinity of room temperature, the gate valve 660 was slowly and slightly opened to return an interior of the second vacuum container 610 to atmospheric pressure, the gate valve 660 was opened and the molded resin article was taken out.

By measurement of light absorption spectrum of the obtained resin film 300, optical microscope observation (usual field of view), polarization microscope observation, scanning type electron microscope observation of the surface of the resin thin film, and transmission electron microscope observation of the resin thin film section, it was confirmed that the molecule dispersion and dissolution of the sublimable organic compound occurred inside the resin film 300, and the surface layer was modified/colored. Moreover, any crystals of the sublimable organic compound were not observed in the surface and the inside portion of the obtained resin film.

By using the apparatus of the present example (FIG. 6), and observing the aforementioned procedure, the temperature of the first vacuum container 510 is kept to be constant, and the surface of the molded resin article can continuously be modified/colored until the sublimable organic compound charged into the first vacuum container 510 is completely consumed.

Example 7

Figure 7:
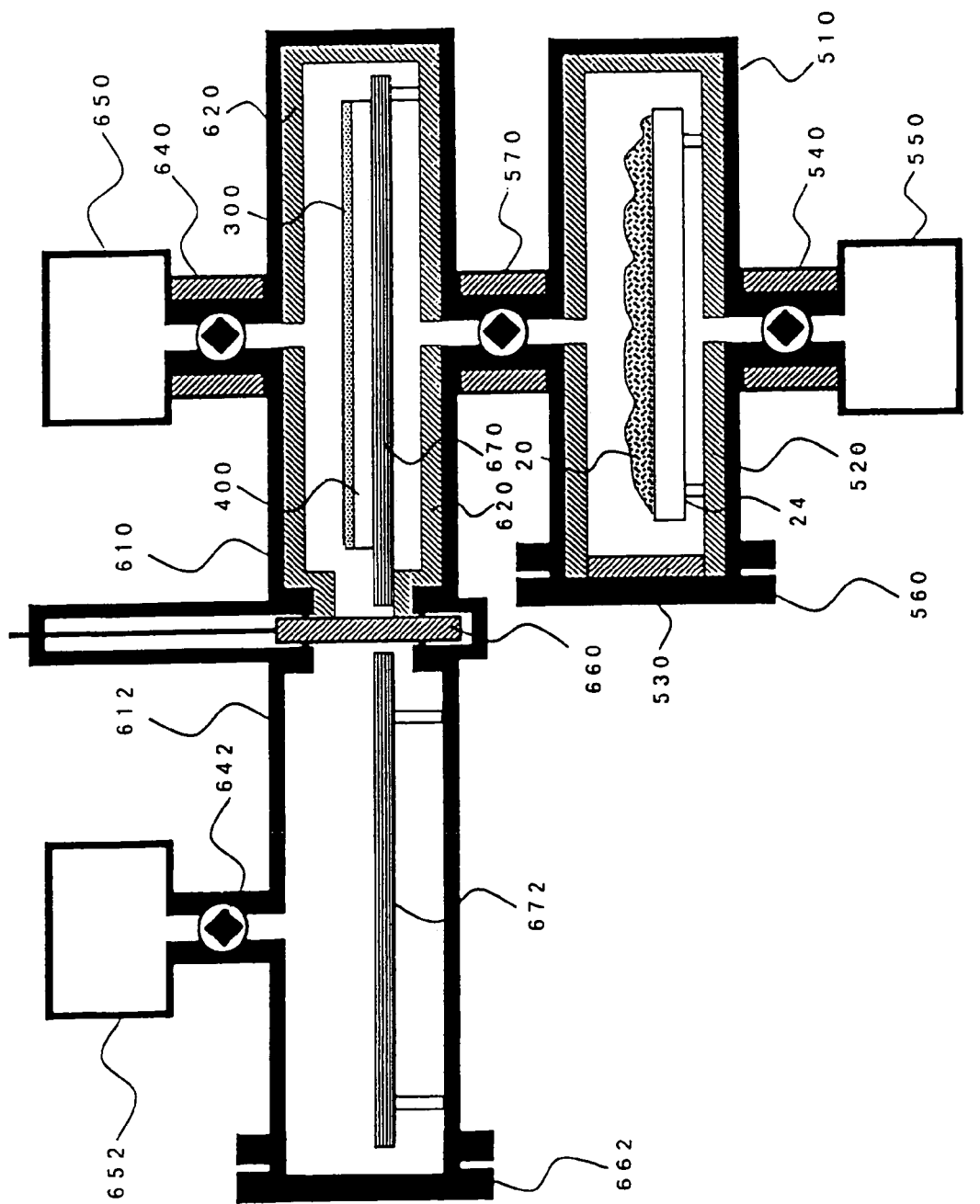
FIG. 7 is a sectional view showing a schematic constitution of the modification/coloring apparatus for the resin surface layer in the modification/coloring method of the resin surface layer in Example 7.

FIG. 7 is a sectional view showing a schematic constitution of a resin surface layer modification and/or coloring apparatus of the present example.

In the modification and/or coloring apparatus for the resin surface layer in the present example, a third vacuum container 612 is disposed adjacent to the second vacuum container 610 as the apparatus of Example 6 (FIG. 6) via the gate valve 660 provided with the heater.

The molded resin article is placed on a transport rail 672 in the third vacuum container 612 via a vacuum door 662. Here, by closing the vacuum door 662 and gate valve 660, opening the vacuum valve 642, and adjusting the pressure inside the third vacuum container 612 by a vacuum exhaust system 652, the molded resin article can be introduced into the second vacuum container 610 for treating the molded resin article without returning the pressure in the second vacuum container 610 for treating the molded resin article to atmospheric pressure.

Furthermore, by satisfying the following conditions, without any trouble of crystallizing the sublimable organic compound 20 in the third vacuum container 612, while the temperature of the second vacuum container 610 and first vacuum container 510 is kept, it is possible to continuously modify/color the surface of the molded resin article until the sublimable organic compound charged into the first vacuum container 510 is completely consumed.

The temperature of the first vacuum container 510 and second vacuum container 610 is adjusted to satisfy the saturated sublimation pressure condition of the sublimable organic compound 20. A concrete example is described in Example 6.

When the gate valve 660 is opened, it is necessary to satisfy a condition that the pressure reduction degree in the third vacuum container 612 is equal to that in the second vacuum container 610, the vacuum valve 570 is closed and that the sublimable organic compound vapor is not present inside the second vacuum container 610. When the condition is not satisfied, the sublimable organic compound 20 is possibly crystallized in the third vacuum container 612.

The temperature of the molded resin article introduced into the second vacuum container 610 is preferably heated to the predetermined temperature before the introduction. This is because the second vacuum container 610 is in the reduced pressure state, only the heating by the radiant heat is effective and much time is required for raising the temperature. Concretely, after performing the heating to obtain the predetermined temperature under atmospheric pressure immediately before the introduction into the third vacuum container 612, and delivering the material into the third vacuum container 612, the pressure reduction is quickly performed, and the material may be transported into the second vacuum container 610 in a "vacuum heat insulation state".

To transport the molded resin article treated in the second vacuum container 610 for a predetermined time into the third vacuum container 612 and then take out the material into the atmosphere, the following procedure is preferably performed. First, by closing the vacuum valve 570 provided with the heater for separating the first vacuum container 510 from the second vacuum container 610, and opening the vacuum valve 640, the sublimable organic compound vapor remaining in the second vacuum container 610 is exhausted. In this case, the pressure in the third vacuum container 612 is adjusted to be equal to that in the second vacuum container 610. Subsequently, after opening the gate valve 660, and transporting the molded resin article into the third vacuum container 612 from the second vacuum container 610, the gate valve 660 is closed. After the temperature of the molded resin article drops to the predetermined temperature, the molded resin article is taken out into the atmosphere by opening the vacuum door 662. Here, it is necessary to note a phenomenon in which the sublimable organic compound is vaporized and detached from the resin surface layer in the third vacuum container 612 of the reduced pressure state. This cannot be ignored for the organic compound with a high saturated vapor pressure. In order to prevent this, effective is a technique of introducing air or inactive gas into the third vacuum container 612 in a stage in which the temperature of the molded resin article is higher than the room temperature to return the pressure to the atmospheric pressure and rapidly cooling the molded resin article.

Example 8

Figure 8:
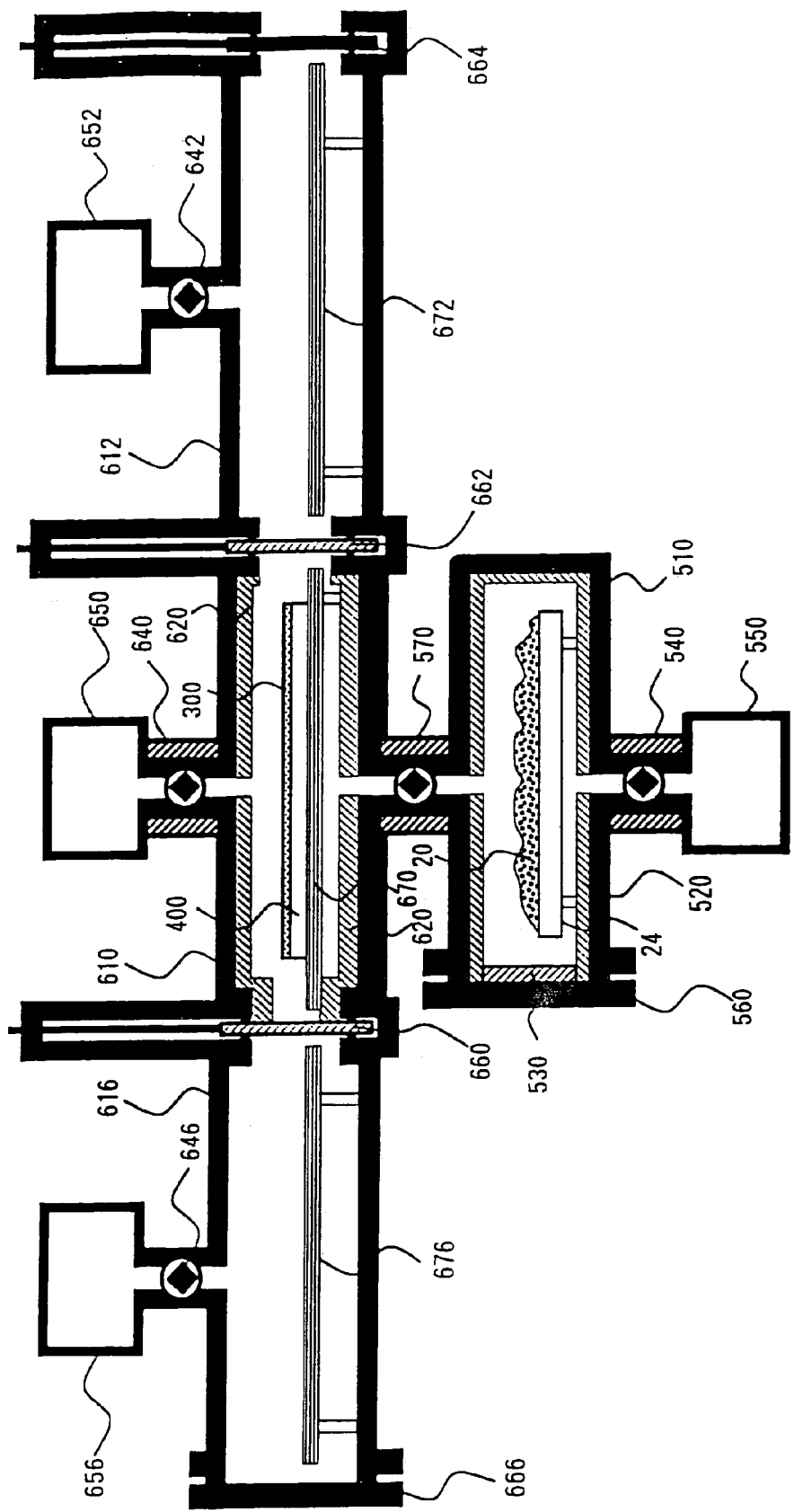
FIG. 8 is a sectional view showing a schematic constitution of the modification/coloring apparatus for the resin surface layer in the modification/coloring method of the resin surface layer in Example 8.

FIG. 8 is a sectional view showing a schematic constitution of a modification and/or coloring apparatus for a resin surface layer in the present example.

In the modification and/or coloring apparatus for the resin surface layer in the present example, adjacent to the second vacuum container 610 as the apparatus of Example 6 (FIG. 6), a fourth vacuum container 616 is disposed via the gate valve 660 provided with the heater, and the third vacuum container 612 is further disposed via the gate valve 662 provided with the heater. The fourth vacuum container 616 in the present example apparatus fulfills a role similar to that of the third vacuum container 612 in Example 7 (FIG. 7) during the introduction of the molded resin article into the apparatus, but is used only to transport the molded resin article to the second vacuum container 610. The third vacuum container 612 in the present-example apparatus is used to take the molded resin article out of the apparatus, or to send the material to an apparatus (not shown) for the next process. Alternatively, the apparatuses for the next process such as a sputtering apparatus (not shown) may be disposed in the third vacuum container 612.

The apparatus described in Example 7 (FIG. 7) is suitable for performing the modification/coloring only of the surface of the molded resin article. On the other hand, the present example apparatus is suitable for continuously transporting the molded resin article to another processing process subsequent to the modification/coloring of the surface of the molded resin article.

The molded resin article is placed on a transport rail 676 in the fourth vacuum container 616 via a vacuum door 666. Here, by closing the vacuum door 666 and gate valve 660, opening a vacuum valve 646, and adjusting the pressure inside the fourth vacuum container 616 by a vacuum exhaust system 656, the molded resin article can be introduced into the second vacuum container 610 for treating the molded resin article without returning the pressure in the second vacuum container 610 for treating the molded resin article to the atmospheric pressure.

Furthermore, by satisfying the following conditions, without any trouble of crystallizing the sublimable organic compound 20 in the fourth vacuum container 616 and/or the third vacuum container 612, while the temperature of the second vacuum container 610 and first vacuum container 510 is kept, it is possible to continuously modify/color the surface of the molded resin article until the sublimable organic compound charged into the first vacuum container 510 is completely consumed.

The temperature of the first vacuum container 510 and second vacuum container 610 is adjusted to satisfy the saturated sublimation pressure condition of the sublimable organic compound 20. The concrete example is described in Example 6.

When the gate valve 660 is opened, it is necessary to satisfy a condition that the pressure reduction degree in the fourth vacuum container 616 is equal to that in the second vacuum container 610, the vacuum valve 570 is closed and that no sublimable organic compound vapor is present inside the second vacuum container 610. When the condition is not satisfied, the sublimable organic compound 20 is possibly crystallized in the fourth vacuum container 616.

The temperature of the molded resin article introduced into the second vacuum container 610 is preferably heated to the predetermined temperature before the introduction. This is because the second vacuum container 610 is in the reduced pressure state, only the heating by the radiant heat is effective and much time is required for raising the temperature. Concretely, after performing the heating to obtain the predetermined temperature under atmospheric pressure immediately before the introduction into the fourth vacuum container 616, and delivering the material into the fourth vacuum container 616, the pressure reduction is quickly performed, and the material may be transported into the second vacuum container 610 in the "vacuum heat insulation state".

To transport the molded resin article treated in the second vacuum container 610 for the predetermined time into the third vacuum container 612 and then take out the material into the atmosphere, the following procedure is preferably performed. First, by closing the vacuum valve 570 provided with the heater for separating the first vacuum container 510 from the second vacuum container 610, and opening the vacuum valve 640, the sublimable organic compound vapor remaining in the second vacuum container 610 is exhausted. In this case, the pressure in the third vacuum container 612 is adjusted to be equal to that in the second vacuum container 610.

Subsequently, after opening the gate valve 662, and transporting the molded resin article into the third vacuum container 612 from the second vacuum container 610, the gate valve 662 is closed. After the temperature of the molded resin article drops to the predetermined temperature, the molded resin article is taken out into the atmosphere by opening the vacuum door 664, or transported to the next process. Here, it is necessary to note the phenomenon in which the sublimable organic compound is vaporized and detached from the resin surface layer in the third vacuum container 612 of the reduced pressure state. This cannot be ignored for the organic compound with the high saturated vapor pressure. In order to prevent this, effective is the technique of introducing air or inactive gas into the third vacuum container 612 in the stage in which the temperature of the molded resin article is higher than the room temperature to return the pressure to the atmospheric pressure and rapidly cooling the molded resin article.

Example 9

Figure 9:
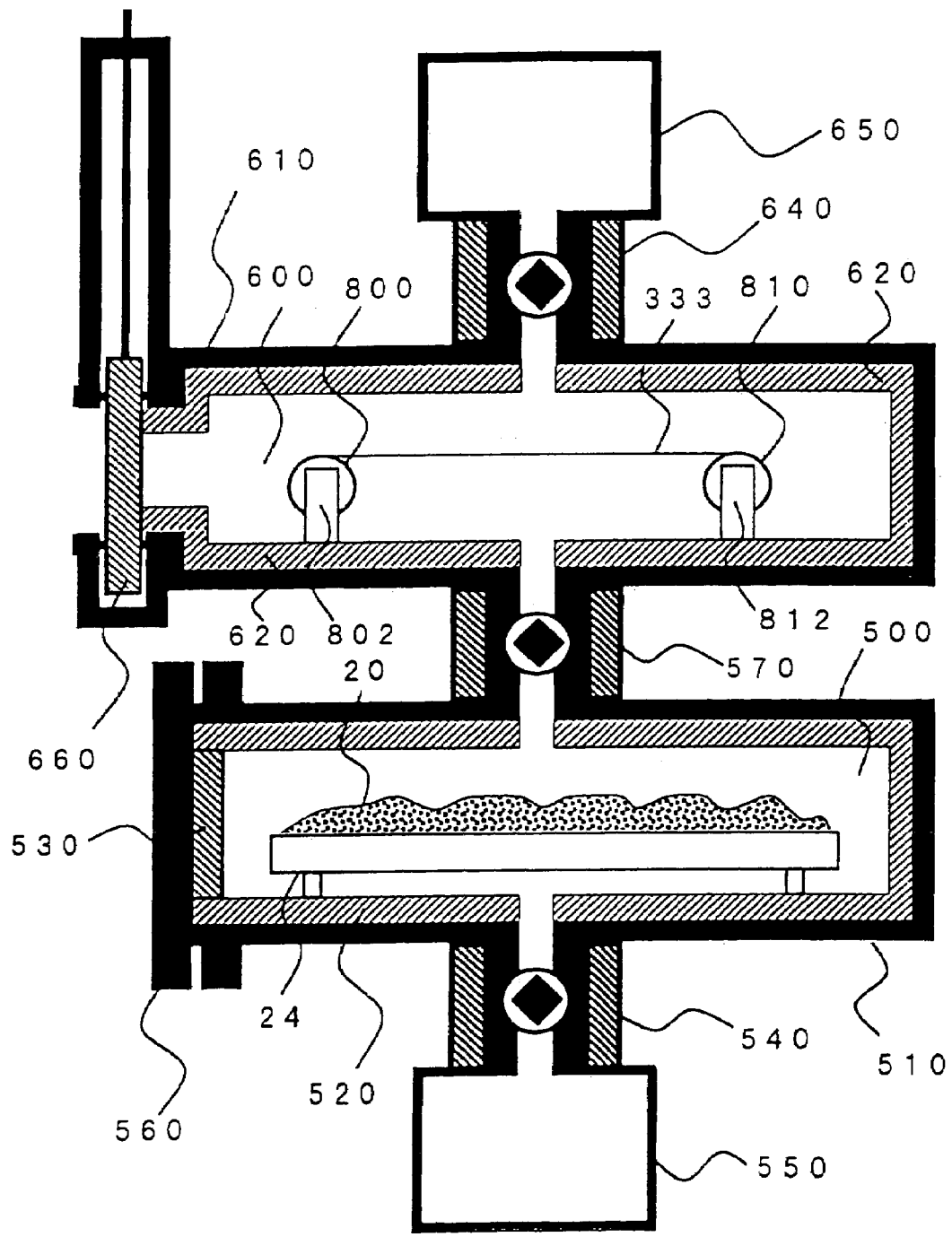
FIG. 9 is a sectional view showing a schematic constitution of the modification/coloring apparatus for the resin surface layer in the modification/coloring method of the resin surface layer in Example 9.

FIG. 9 is a sectional view showing a schematic constitution of a modification and/or coloring apparatus for a resin surface layer in the present example. In the present example apparatus, instead of the transport rail in the apparatus of Example 6 (FIG. 6), reel rests 802 and 812 are attached to the interior of the second vacuum container 610 for treating the molded resin article. The reel rests 802 and 812 are provided with a supply side reel 810 for supplying a resin film or fiber 333 and a reception side reel 800 for wind-up, and by rotating the reception side reel by mechanisms such as a rotary introducing machine (not shown), the resin film or fiber 333 is continuously treated.

For the treatment, first the sublimable organic compound 20 having the sublimation properties and the affinity for a resin of the molded resin article to be coated is placed in the tray 24, and introduced into the first vacuum container 510 via the vacuum door 560. By closing the vacuum door 560 and vacuum valves 540 and 570, the interior of the first vacuum container 510 turns to the first closed space 500.

On the other hand, the resin film or fiber 333 wound up around the supply side reel 800 and the reception side reel 800 are introduced into the second vacuum container 610 via the gate valve 660, and attached to the reel rests 812 and 802, so that the resin film or fiber 333 is taken up to the reception side reel 800 from the supply side reel 810. By closing the gate valve 660 and vacuum valves 640 and 570, the interior of the second vacuum container 610 turns to the second closed space 600.

There was controlled the heating by the heater 620 attached to the entire surface of the inside wall of the second vacuum container 610, a gate valve 660 provided with, the heater, and vacuum valves 640 and 570 provided with the heaters, whereby the temperature in the second closed space 600 was controlled to the same temperature as in the first closed space 500. For the set temperature, the temperature at which the organic compound 20 having the sublimation properties and the affinity for the resin of the molded resin article to be coated sublimes without thermal decomposition is set as the lower limit, the highest temperature among the temperatures satisfying the following conditions is set as the upper limit, and temperature control is precisely performed.

(a) A temperature which does not exceed the melting start temperature of the sublimable organic compound 20, (b) a glass transition temperature of the resin, (c) a temperature which does not exceed the thermal deformation start temperature of the resin, and (d) a temperature which does not exceed the melting start temperature of the resin.

Moreover, there was controlled the heating by the heater 520 attached to the entire surface of the inside wall of the first vacuum container 510, a heater 530 for the vacuum door 560, and vacuum valves 540 and 570 provided with the heaters, whereby the temperature in the first closed space 500 was controlled to the same temperature as in the second closed space 600.

By opening the vacuum valve 540 provided with the heater and attached to the first vacuum container 510 to connect the vacuum exhaust system 550, the pressure in the first closed space 500 was brought to the saturated sublimation pressure state of the sublimable organic compound 20, and subsequently, the vacuum valve 540 was closed. Additionally, when the vacuum valve 540 is kept to be open, the vapor of the sublimable organic compound 20 escapes into the vacuum exhaust system 550. Therefore, in order to compensate for the pressure reduction degree drop by leak from each portion of the vacuum apparatus, control is performed by sometimes opening and closing the vacuum valve 540 in such a manner that the pressure in the first closed space 500 reaches the saturated sublimation pressure of the sublimable organic compound 20.

On the other hand, when the vacuum valve 640 provided with the heater and attached to the second vacuum container 610 is opened and connected to the vacuum exhaust system 650, the pressure in the second closed space 600 is set to be equal to or less than the saturated sublimation pressure of the sublimable organic compound 20 at the temperature. Thereafter, the vacuum valve 640 is closed, and in order to compensate for the pressure reduction degree drop by the leak from each vacuum apparatus portion, by sometimes opening and closing the vacuum valve 640, control is performed in such a manner that the pressure in the second space 600 becomes equal to or less than the saturated sublimation pressure of the sublimable organic compound 20.

Subsequently, by opening the vacuum valve 570, provided with the heater, for separating the first vacuum container 510 from the second vacuum container 610, and connecting the first closed space 500 to the second closed space 600, the first closed space 500 and second closed space 600 are combined to form the third closed space. Furthermore, the temperature and pressure are controlled in such a manner that the entire third closed space is brought to the saturated sublimation pressure state of the sublimable organic compound. In this manner, the vapor of the sublimable organic compound 20 with which the first closed space 500 before the connection is filled and dispersed into the second closed space 600 before the connection. In this case, by slightly opening the vacuum valve 640 to the vacuum exhaust system 650 from the second vacuum container 610, and controlling the pressure in the second vacuum container 610 to be lower than that in the first vacuum container 510, the process of allowing the vapor of the sublimable organic compound 20 to disperse into the second vacuum container 610 from the first vacuum container 510 is promoted. However, if the vacuum valve 640 is kept to be open, the vapor of the sublimable organic compound 20 escapes to the vacuum exhaust system 650.

In the second vacuum container 610 filled with the vapor of the sublimable organic compound 20, by rotating the reception side reel, the rein film or fiber 333 is moved to the reception side reel 800 from the supply side reel 810 at a constant speed, for example, 10 mm/minute.

As described above, by uniformly depositing the vapor of the sublimable organic compound 20 generated in the first vacuum container 510 on the surface of the resin film or fiber 333 placed in the second vacuum container 610, the deposited sublimable organic compound 20 can be allowed to penetrate/disperse from the surface of the molded resin article into its inside.

After the charged resin film or fiber 333 is all supplied to the reception side reel 800 by the supply side reel 810, the vacuum valve 570, provided with the heater, for separating the first vacuum container 510 from the second vacuum container 610 is closed. Subsequently, the vacuum valve 640 is opened to exhaust the vapor of the sublimable organic compound 20 remaining in the second vacuum container 610, and the temperature of the second vacuum container 610 is cooled to the vicinity of the room temperature. Thereafter, the gate valve 660 is slowly slightly opened, the interior of the second vacuum container 610 is returned to the atmospheric pressure, the gate valve 660 is opened, and the resin film or fiber 333 wound up on the reception side reel 800 is taken out.

The present example apparatus can preferably used, particularly, for a purpose of providing the surface layer of the fiber with the photochromic function, or providing the surface layer of the plastic sheet with the ultraviolet absorbing function. Furthermore, the apparatus can also be used for providing the surface layer of the plastic sheet with the medicinal activity function or the function as the agricultural chemical.

Example 10

Similarly as Except 9 except that a plastic optical fiber is used instead of the resin film or fiber 333 in Example 9, the surface layer of the plastic optical fiber is modified, a surface layer refractive index is changed, and the photochromic function or the fluorescence function can be given.

Example 11

Treatment was performed similarly as Example 1 except that instead of cis-1,2-dicyano-1,2-bis(2,4,5-trimethyl-3-thienyl)ethene used as the organic compound having the sublimation properties and an affinity for a resin of the molded resin article to be coated, 9,10-diphenylanthracene was used, instead of the pellet of bisphenol A polycarbonate used as the molded resin article in Example 1, a pellet (cylindrical shape, outer diameter=2.5 mm, and length=3 mm) of polysulfone (manufactured by Ardrich Chemical Co. Ltd.) was used, instead of the heating temperature of 110° C. in Example 1, a treatment temperature was set to 150° C., and instead of the treatment time of 24 hours in Example 1, the treatment time was set to 48 hours.

When the pellet was placed in a dark place, and irradiated with an ultraviolet lamp, a bright blue fluorescent light was observed from the surface of a pellet. That is, it is apparent that the sublimable organic compound penetrates/disperses into the polycarbonate resin surface layer, so that the surface layer is modified to impart a function of fluorescence to the surface layer.

Example 12

Figure 12:
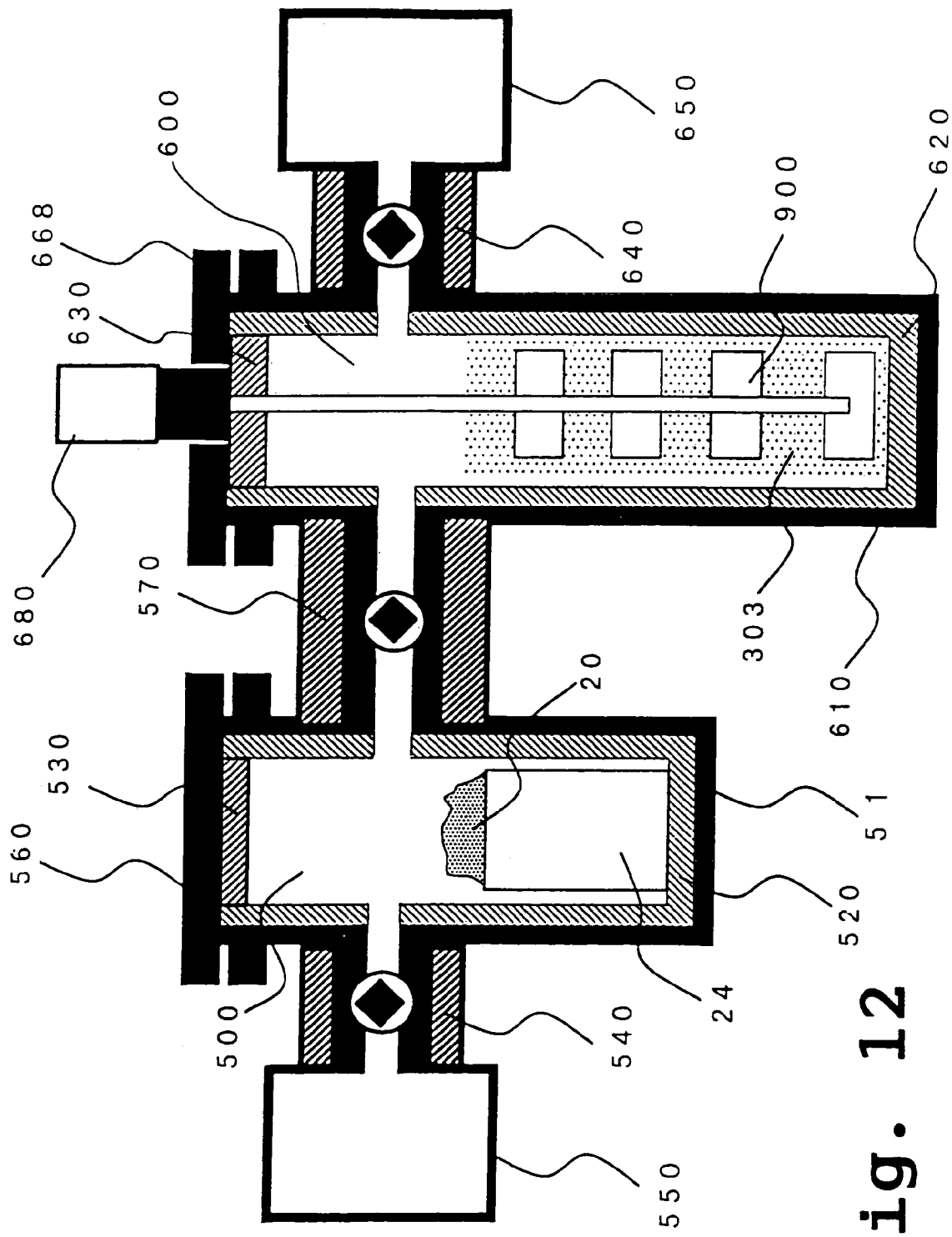
FIG. 12 is a sectional view showing a schematic constitution of the modification/coloring apparatus for the resin surface layer in the modification/coloring method of the resin surface layer in Example 12.

FIG. 12 is a sectional view showing a schematic constitution of a modification and/or coloring apparatus for a resin surface layer in the present example. This apparatus is suitable for the modification of the surface layer and/or the coloring of the powdery resin.

As the organic compound 20 having the sublimation properties and an affinity for a resin of the molded resin article to be coated, cis-1,2-dicyano-1,2-bis(2,4,5-trimethyl-3-thienyl)ethene was placed in the tray 24, and introduced into the first vacuum container 510 through the vacuum door 560. By closing the vacuum door 560 and vacuum valves 540 and 570, the interior of the first vacuum container 510 turns to the first closed space 500.

On the other hand, as the molded resin article, a colorless type (average particle diameter of 20 μm) of thermosetting acrylic modified resin fine powder "Rubcouleur" (manufactured by DAINICHISEIKA COLOR & CHEMICALS MFG. CO., LTD.) was introduced into the second vacuum container 610 through a vacuum door 668 provided with a stirrer 668. During introduction, the vacuum valves 570 and 640 are completely closed. Additionally, by closing the vacuum door 668 and vacuum valves 640 and 570, the interior of the second vacuum container 610 forms the second closed space 600.

Under atmospheric pressure, i.e., in a slightly open state of the vacuum door 668, there was controlled the heating by the heater 620 attached to the entire surface of the inside wall of the second vacuum container 610, a heater 630 for the vacuum door 668, and vacuum valves 540 and 570 provided with the heaters, whereby the temperature in the second closed space 600 was controlled to 110° C., i.e., the same temperature as in the first closed space 500. Furthermore, the powdery resin in the second vacuum container 610 was stirred using a stirring blade 900 driven by a magnet coupling type stirring motor 680 attached to the vacuum door 668, so that the entire powdery resin reached the temperature. After the powdery resin temperature reached the temperature, the vacuum door 668 was completely closed.

Moreover, there was controlled the heating by the heater 520 attached to the entire surface of the inside wall of the first vacuum container 510, a heater 530 for the vacuum door 560, and vacuum valves 540 and 570 provided with the heaters, whereby the temperature in the first closed space 500 was controlled to 110° C., i.e., the same temperature as in the second closed space 600. As described in Example 1, the sublimable organic compound sublimes in 110° C. without thermal decomposition.

By opening the vacuum valve 540 provided with the heater and attached to the first vacuum container 510 and connecting the vacuum exhaust system 550, the pressure in the first closed space 500 was brought to the saturated sublimation pressure state of the sublimable organic compound, and subsequently, the vacuum valve 540 was closed. Additionally, when the vacuum valve 540 is kept to be open, the sublimable organic compound vapor escapes into the vacuum exhaust system 550. Therefore, in order to compensate for the pressure reduction degree drop by leak from each portion of the vacuum apparatus, control was performed by sometimes opening and closing the vacuum valve 540 in such a manner that the pressure in the first closed space 500 reached the saturated sublimation pressure of the sublimable organic compound.

On the other hand, the powdery resin in the second vacuum container 610 is stirred using the stirring blade 900 attached to the vacuum door 668 and driven by the magnet coupling type stirring motor 680, the vacuum valve 640 provided with the heater and attached to the second vacuum container 610 is gradually opened, and the vacuum exhaust system 650 is connected. Thereby, the pressure in the second closed space 600 was set to be equal to or less than the saturated sublimation pressure of the sublimable organic compound at the temperature (110° C.). In this case, when the vacuum valve 640 is rapidly opened, the powdery resin vigorously flies up and therefore care needs to be taken. Subsequently, the vacuum valve 640 was closed, and in order to compensate for the pressure reduction degree drop by the leak from each vacuum apparatus portion, by sometimes opening and closing the vacuum valve 640, control was performed in such a manner that the pressure in the second space 600 became equal to or less than the saturated sublimation pressure of the sublimable organic compound.

Subsequently, by opening the vacuum valve 570, provided with the heater, for separating the first vacuum container 510 from the second vacuum container 610, and connecting the first closed space 500 to the second closed space 600, the first closed space 500 and second closed space 600 were combined to form the third closed space. Furthermore, the temperature and pressure were controlled in such a manner that the entire third closed space was brought to the saturated sublimation pressure state of the sublimable organic compound. Moreover, the powdery resin in the second vacuum container 610 was continuously stirred using the stirring blade 900 driven by the magnetic coupling type stirring motor 680 attached to the vacuum door 668. In this manner, the sublimable organic compound vapor with which the first closed space 500 before the connection was filled and dispersed into the second closed space 600 before the connection. In this case, by slightly opening the vacuum valve 640 to the vacuum exhaust system 650 from the second vacuum container 610, and controlling the pressure in the second vacuum container 610 to be lower than that in the first vacuum container 510, the process of allowing the sublimable organic compound vapor to disperse into the second vacuum container 610 from the first vacuum container 510 is promoted However, if the vacuum valve 640 is kept to be open, the sublimable organic compound vapor escapes to the vacuum exhaust system 650.

As described above, the temperature and the pressure are controlled to the predetermined levels, whereby the sublimable organic compound vapor generated in the first vacuum container 510 is uniformly deposited on the surface of the powdery resin stirred in the second vacuum container 610, and the deposited sublimable organic compound can penetrate/disperse from the surface of the molded resin article into its inside. After continuing this process for a predetermined time, for example, 12 hours, and closing the vacuum valve 570, provided with the heater, for separating the first vacuum container 510 from the second vacuum container 610, the vacuum valve 640 was opened to exhaust the remaining sublimable organic compound vapor from the second vacuum container 610. Subsequently, after cooling the temperature of the second vacuum container 610 in the vicinity of room temperature, the vacuum door 668 was slowly and slightly opened to return an interior of the second vacuum container 610 to atmospheric pressure, the vacuum door 668 was completely opened and the molded resin article was taken out.

By the optical microscope observation and scanning type electron microscope observation of the obtained powdery resin, it was confirmed that the entire surface of the powdery resin was uniformly colored by the photochromic compound. Moreover, the presence of the fine crystals of the photochromic compound was not confirmed in the powdery resin.

The obtained powdery resin turns to yellow by the irradiation of the visible ray of the cut ultraviolet ray and/or the infrared ray, and turns to red by the irradiation of the ultraviolet ray. That is, by modifying the surface layer of the powdery resin, the function as the powdered photochromic resin was confirmed.

Example 13

A plastic resin surface layer was modified using the photochromic dyestuff, and provided with the photochromic function similarly as Example 6, except that a poly(methyl methacrylate) plastic lens was used as the molded resin article instead of the polycarbonate resin thin film formed on one surface of the circular glass substrate 400 in Example 6, and a rest for holding a plastic lens edge was utilized.

Even by using a glass lens whose surface is coated with a resin instead of the plastic lens, the surface layer can be similarly modified using the photochromic dyestuff and provided with the photochromic function.

Moreover, by using the usual sublimable dyestuff as the organic compound having the sublimation properties and an affinity for a resin of the molded resin article to be coated instead of the photochromic dyestuff, the surface layer of the plastic lens or the resin coated lens can be modified, and also colored in an arbitrary color.

Example 14

In a screw vial having a volume of 50 ml, there were placed 5 or 6 pellets (cylindrical shape, outer diameter=about 2.5 mm, and length=2.5 mm) of bisphenol A polycarbonate (manufactured by Ardrich Chemical Co., Ltd.) as a molded resin article, and crystals of ferrocene carboxy aldehyde (manufactured by Ardrich Chemical Co., Ltd., melting point=117° C.) as an organic compound 20 having sublimation properties and an affinity for a resin of the molded resin article to be coated, and the screw vial was then sealed with a lid. Thereafter, the screw vial was placed in the thermostatic chamber whose temperature was set to 120° C., and then heated under atmospheric pressure. With temperature rise in the screw vial, the sublimation of ferrocene carboxy aldehyde started, and the inside portion of the screw vial reached a saturated vapor pressure state. After continuing the heating for 4 hours, the inside portion of the screw vial was cooled to room temperature in 4 hours.

The surface layer of the obtained polycarbonate pellets was colored in a bright orange color inherent in the ferrocene derivative.

The section of each of the obtained polycarbonate pellets was observed and analyzed with an X ray micro-analyzer attached to a scanning type electron microscope, and as a result, it was confirmed that an iron element was distributed over a depth of about 10 micrometers from the surface of the pellet. That is, it was confirmed that the molecules of the sublimable organic compound were distributed in the resin pellet, in other words, the surface layer was modified and colored.

Example 15

Ten commercial polypropylene dress hangers for as molded resin articles and 20 g of camphor (mp 178° C., manufactured by Wako Pure Chemical Industries, Ltd.) which was put in a glass evaporating dish were placed in a vacuum drier (manufactured by Yamato Kagaku Co., Ltd., DP41 model), and a vacuum door was tightly closed. Next, a vacuum valve of an air suction port was completely closed, and heating was started, with a vacuum valve of an exhaust port being slightly opened. When the surface temperature of an inside wall reached 100° C., the vacuum valve of the exhaust port was completely closed to obtain an airtight state. Thereafter, while an inside temperature was controlled so as to be within a range of 100° C. to 105° C., the heating was continued. Camphor in the glass evaporating dish was observed through an observation window of the vacuum drier, and after complete sublimation, the inside temperature was kept in the above temperature range for 2 hours. Next, the heating was stopped, and the system was allowed to stand for 12 hours. The air suction port was then opened so that the inside pressure might be the atmospheric pressure. Afterward, the vacuum door was opened, and the hanger was then taken out. Any camphor crystals were not deposited in the vacuum drier and on the surface of the hanger. The weight of each hanger was measured, and it was apparent that the weight increased as much as 2 g on average. It can be judged that camphor penetrates and disperses into the surface layer of the hanger to increase the weight. The polypropylene dress hanger whose surface layer is modified in this manner exerts an insecticidal function of camphor for a long term.

Comparative Example 3

Camphor was kneaded with polypropylene and injection molding was then tried, but weight reduction due to the sublimation of camphor was remarkable, so that it was difficult to obtain a molded material whose composition was constant. Moreover, since a large amount of a camphor vapor was generated in an operation environment, it has been found that for the preservation of the operation environment and the atmosphere, a local exhaust device and an exhaust treatment apparatus are additionally required.

Next, a method was tried which comprised the steps of immersing the polypropylene dress hanger in a toluene solution of camphor and then impregnating its surface layer with camphor. The impregnation with a certain amount of camphor was confirmed, but toluene used as the solvent also penetrates into polypropylene, and it is therefore impossible to use the hanger as a daily necessity as it is. Therefore, toluene was completely removed by heating/drying the hanger at 60° C. under reduced pressure for a long time in a vacuum drier, and at this time, the weight of camphor in the hanger was about 1/50 of the weight in Example 15. It has been understood that efficiency is remarkably low as compared with the method of Example 15.

POSSIBILITY OF INDUSTRIAL UTILIZATION

As described above in detail, according to a modification method of the surface layer of a molded resin article, an apparatus therefor and a molded resin article whose surface layer is modified, a coloring method of the surface layer of the molded resin article, an apparatus therefor and a molded resin article whose surface layer is colored, and a molded resin article to which functional characteristics are imparted by the modification of the surface layer which are concerned with the present invention, it is possible to prepare a modified surface layer comprising a sublimable organic compound and a resin and having a uniform composition on the surface of the molded resin article, to prepare the modified surface layer containing the sublimable organic compound and containing no volatile impurities on the surface of the molded resin article, to efficiently prepare the modified surface layer comprising the sublimable organic compound and a resin and having a uniform composition on the surface of the molded resin article, to prepare the modified surface layer containing the sublimable organic compound on the surface of the molded resin article without impairing a surface smoothness of the molded resin article, when the surface of the molded resin article is finely worked, to prepare the modified surface layer containing the sublimable organic compound on the surface of the molded resin article without impairing the worked surface structure, to prepare the modified surface layer containing many kinds of sublimable organic compounds on the surface of the molded resin article, to prepare the modified surface layer containing the sublimable organic compound uniform in film thickness and/or composition on the surface of the molded resin article without any complicated mechanical control, to prepare the modified surface layer containing the sublimable organic compound having a uniform film thickness and/or composition on the surface of the molded resin article irrespective of a size of an area of the surface layer, and to provide the molded resin article having the modified surface layer having the aforementioned characteristics.

Furthermore, it is possible to prepare a colored surface layer comprising a sublimable dyestuff and a resin and having a uniform composition on the surface of the molded resin article, to prepare the colored surface layer containing the sublimable dyestuff and containing no volatile impurities on the surface of the molded resin article, to efficiently prepare the colored surface layer comprising the sublimable dyestuff and a resin and having the uniform composition on the surface of the molded resin article, to prepare the colored surface layer containing the sublimable dyestuff on the surface of the molded resin article without impairing the surface smoothness of the molded resin article, when the surface of the molded resin article is finely worked, to prepare the colored layer containing the sublimable dyestuff on the surface of the molded resin article without impairing the worked surface structure to prepare the colored surface layer containing many kinds of sublimable dyestuffs on the surface of the molded resin article, to prepare the colored surface layer containing the sublimable dyestuff uniform in film thickness and/or composition on the surface of the molded resin article without any complicated mechanical control, to prepare the colored surface layer containing the-sublimable dyestuff and having the uniform film thickness and/or composition on the surface of the molded resin article irrespective of an area size of the surface layer, to provide the molded resin article with the colored surface layer having the aforementioned characteristics, and to provide the molded resin article in which the surface layer is modified to impart the functional characteristics to the surface layer.

Moreover, the functional characteristics can be imparted to the surface layer of the molded resin article by the use of a remarkably smaller amount of a functional material as compared with a case where the functional material is kneaded with the whole resin to give the functional characteristics.

What is claimed is:

1. A modification method of a surface layer of a molded resin article which comprises the steps of:
    placing, in a first closed space, an organic compound having sublimation properties and an affinity for a resin of the molded resin article to be coated;
    placing the molded resin article in a second closed space;
    controlling a temperature in the second closed space so as to be equal to or higher than the temperature in the first closed space;
    bringing a pressure in the first closed space to a saturated sublimation pressure state of the organic compound;
    controlling a pressure in the second closed space so as to be equal to or lower than the pressure in the first closed space;
    subsequently, connecting the first closed space to the second closed space to form a third closed space in which the first closed space is combined with the second closed space, and further controlling the temperature and the pressure so that the whole of the third closed space may be in the saturated sublimation pressure state of the organic compound;
    allowing a vapor of the organic compound with which the first closed space before the connection is filled to diffuse into the second closed space before the connection;
    uniformly depositing the vapor of the organic compound on the surface of the molded resin article; and
    allowing the deposited organic compound to penetrate/disperse from the surface of the molded resin article into its inside.

2. The modification method of the resin surface layer according to claim 1 which comprises the steps of:
    placing the organic compound having the sublimation properties and the affinity for the resin of the molded resin article to be coated in a first vacuum container provided with a pipe to an exhaust system, an introducing portion of the organic compound and a connection pipe to a second vacuum container, closing the organic compound introducing portion and the connection pipe to the second vacuum container, reducing the pressure in the first vacuum container through the exhaust system to a saturated sublimation pressure of the organic compound at a temperature which is equal to or higher than room temperature and which does not exceed a thermal decomposition temperature of the organic compound and/or the resin, and raising the temperature in the first vacuum container up to the above temperature;
    placing the molded resin article in the second vacuum container provided with a pipe to an exhaust system, an introducing portion of the molded resin article and a connection pipe to the first vacuum container, and closing the molded resin article introducing portion and the connection pipe to the first vacuum container;
    controlling the temperature in the second vacuum container so as to be equal to or higher than the temperature in the first vacuum container;
    bringing the pressure in the first vacuum container to a saturated sublimation pressure state of the organic compound;
    controlling the pressure in the second vacuum container so as to be equal to or lower than the pressure in the first vacuum container;
    subsequently, connecting the first vacuum container to the second vacuum container via a mutual connection pipe to form the third closed space in which the first closed space in the first vacuum container is combined with the second closed space in the second vacuum container, and further controlling the temperature and the pressure so that the whole of the third closed space may be in the saturated sublimation pressure state of the organic compound;
    allowing the vapor of the organic compound with which the first vacuum container before the connection is filled to diffuse into the second vacuum container before the connection;
    uniformly depositing the vapor of the organic compound on the surface of the molded resin article;
    heating for a predetermined time to allow the deposited organic compound to penetrate/disperse from the surface of the molded resin article into its inside;
    closing the connection pipe which connects the first vacuum container to the second vacuum container;
    controlling the temperature and the pressure in the second vacuum container for a predetermined time so that the vapor of the organic compound which remains inside the second vacuum container may penetrate/disperse from the surface of the molded resin article into its inside;
    when the vapor of the organic compound excessively exists in the second vacuum container, exhausting the vapor of the organic compound from the second vacuum container through the exhaust system; and
    then returning the temperature of the molded resin article in the second vacuum container to ordinary temperature.

3. The modification method of the resin surface layer according to claim 1 further comprising:

transporting the molded resin article under a reduced pressure into a third vacuum container which is disposed adjacent to the second vacuum container via a gate valve and in which the pressure can independently be controlled, and the temperature of the molded resin article is then returned to ordinary temperature.

* * * * *

UNITED STATES PATENT AND TRADEMARK OFFICE
CERTIFICATE OF CORRECTION

PATENT NO. : 7,041,332 B2  Page 1 of 1
APPLICATION NO. : 10/830136
DATED : May 9, 2006
INVENTOR(S) : Takashi Hiraga et al.

It is certified that error appears in the above-identified patent and that said Letters Patent is hereby corrected as shown below:

<u>Title page,</u>
Item [30],
                         Foreign Application Priority Data
      "Feb. 27, 1999   (JP)  ..................................... 11-91038"

Foreign Application Priority Data should read
  -- March 31, 1999   (JP)  ............................. 11-91038 --

Signed and Sealed this

Twenty-second Day of August, 2006

JON W. DUDAS
*Director of the United States Patent and Trademark Office*